(12) United States Patent
Noguchi et al.

(10) Patent No.: US 9,147,458 B2
(45) Date of Patent: Sep. 29, 2015

(54) MAGNETIC RANDOM ACCESS MEMORY

(71) Applicant: Kabushiki Kaisha Toshiba, Tokyo (JP)

(72) Inventors: Hiroki Noguchi, Yokohama (JP); Keiko Abe, Yokohama (JP); Kazutaka Ikegami, Kawasaki (JP); Shinobu Fujita, Inagi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 148 days.

(21) Appl. No.: 13/772,815

(22) Filed: Feb. 21, 2013

(65) Prior Publication Data

US 2013/0322161 A1 Dec. 5, 2013

(30) Foreign Application Priority Data

Jun. 4, 2012 (JP) ................................ 2012-127409

(51) Int. Cl.
G11C 11/00 (2006.01)
G11C 11/16 (2006.01)

(52) U.S. Cl.
CPC ........ *G11C 11/1675* (2013.01); *G11C 11/1659* (2013.01); *G11C 11/1673* (2013.01)

(58) Field of Classification Search
CPC ........... G11C 11/1675; G11C 11/1659; G11C 11/1673
USPC ........................ 365/158, 148, 190, 209, 225.5
See application file for complete search history.

(56) References Cited

U.S. PATENT DOCUMENTS

| | | | |
|---|---|---|---|
| 6,760,244 B2* | 7/2004 | Yamada | 365/63 |
| 6,894,922 B1* | 5/2005 | Hidaka | 365/158 |
| 7,002,837 B2* | 2/2006 | Morimoto | 365/148 |
| 7,203,089 B1* | 4/2007 | Ho | 365/158 |
| 8,199,550 B2* | 6/2012 | Okayama | 365/66 |
| 8,432,727 B2* | 4/2013 | Ryu et al. | 365/158 |
| 8,649,205 B2* | 2/2014 | Peters et al. | 365/148 |

(Continued)

FOREIGN PATENT DOCUMENTS

| | | |
|---|---|---|
| JP | 2002-260377 | 9/2002 |
| JP | 2003-297071 | 10/2003 |

(Continued)

OTHER PUBLICATIONS

Office Action by the Japanese Patent Office mailed on Sep. 10, 2013, for corresponding Japanese Patent Application No. 2012-127409, and English translation thereof.

(Continued)

*Primary Examiner* — Viet Q Nguyen
(74) *Attorney, Agent, or Firm* — Finnegan, Henderson, Farabow, Garrett & Dunner, L.L.P.

(57) ABSTRACT

According to one embodiment, a magnetic random access memory includes a write circuit to write complementary data to first and second magnetoresistive elements, and a read circuit to read the complementary data from the first and second magnetoresistive elements. The control circuit is configured to change the first and second bit lines to a floating state after setting the first and second bit lines to a first potential, and change a potential of the first bit line in the floating state to a first value in accordance with a resistance value of the first magnetoresistive element and a potential of the second bit line in the floating state to a second value in accordance with a resistance value of the second magnetoresistive element by setting the common source line to a second potential higher than the first potential.

16 Claims, 24 Drawing Sheets

(56) References Cited

U.S. PATENT DOCUMENTS

2005/0036361 A1* 2/2005 Fukuzumi ................... 365/158
2011/0063897 A1   3/2011 Ong

FOREIGN PATENT DOCUMENTS

| | | |
|---|---|---|
| JP | 2004-355670 | 12/2004 |
| JP | 2007-323706 | 12/2007 |
| JP | 2009-151885 | 7/2009 |
| JP | 2010-238288 | 10/2010 |
| JP | 2011-192345 | 9/2011 |
| JP | 2011-204287 | 10/2011 |
| JP | 2012-089187 | 5/2012 |

OTHER PUBLICATIONS

Office Action by the Japanese Patent Office mailed on Jun. 4. 2013, for corresponding Japanese Patent Appiication No. 2012-127409, and English-language translation thereof.

* cited by examiner

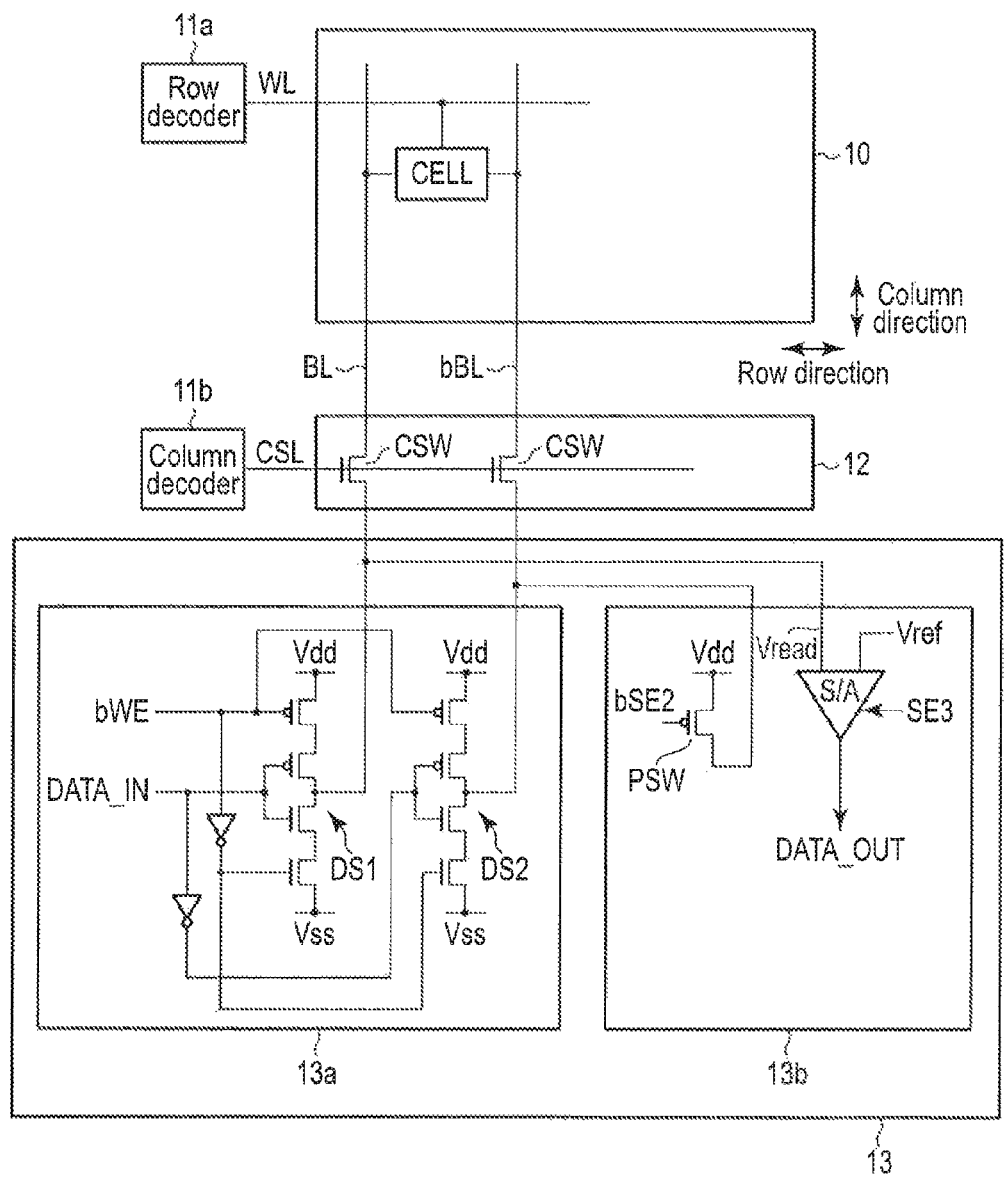
F I G. 2

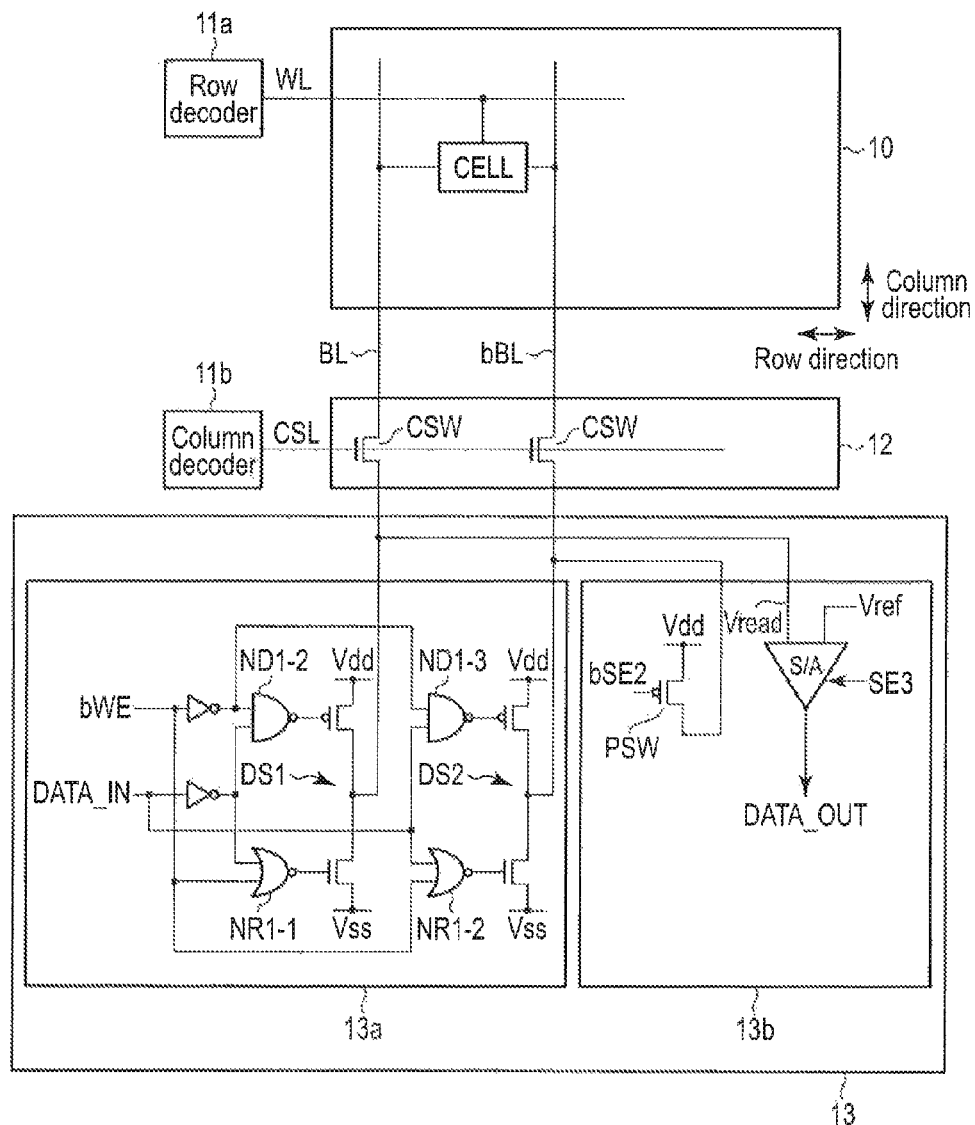
F I G. 3

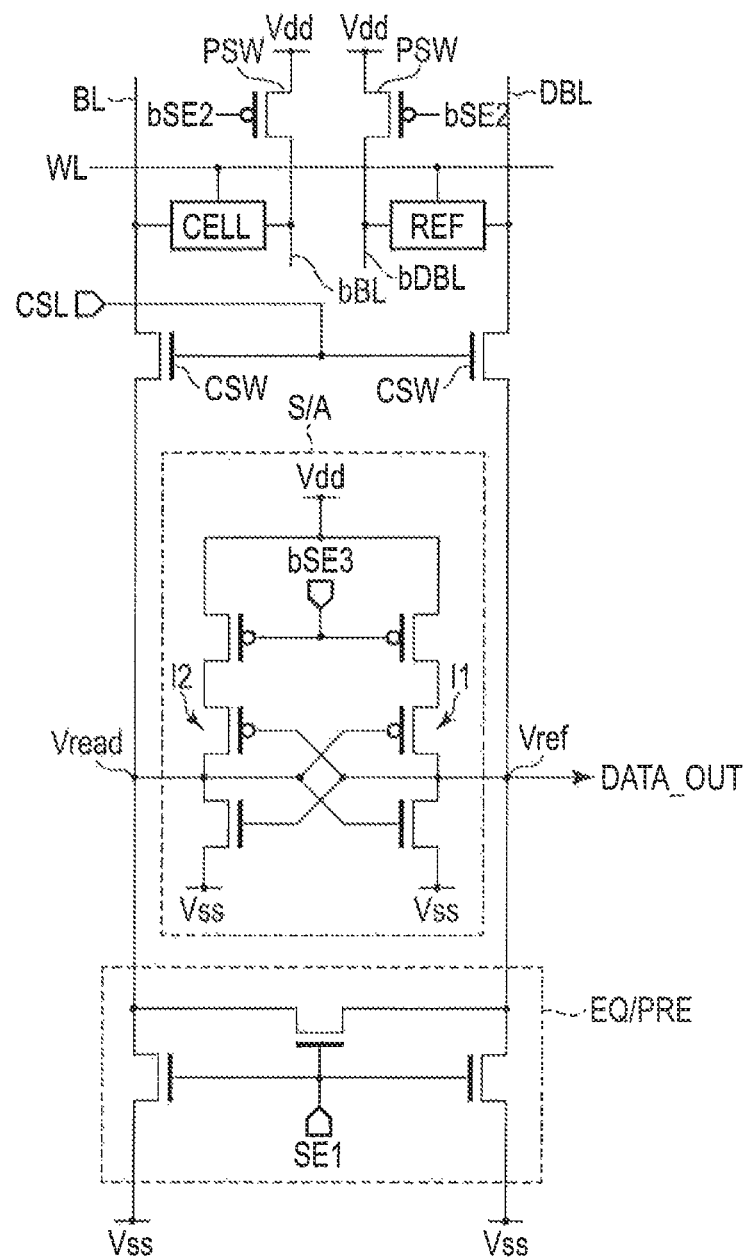
F I G. 6

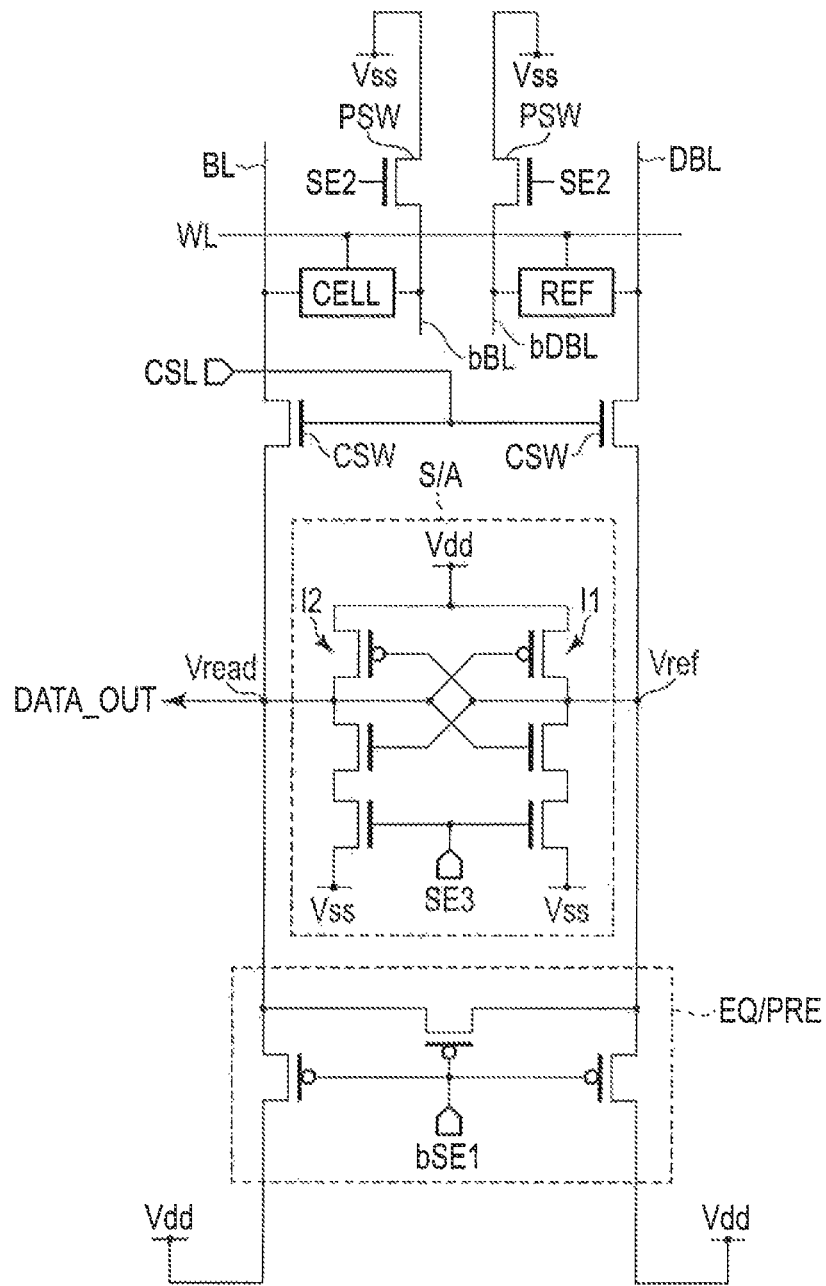
F I G. 8

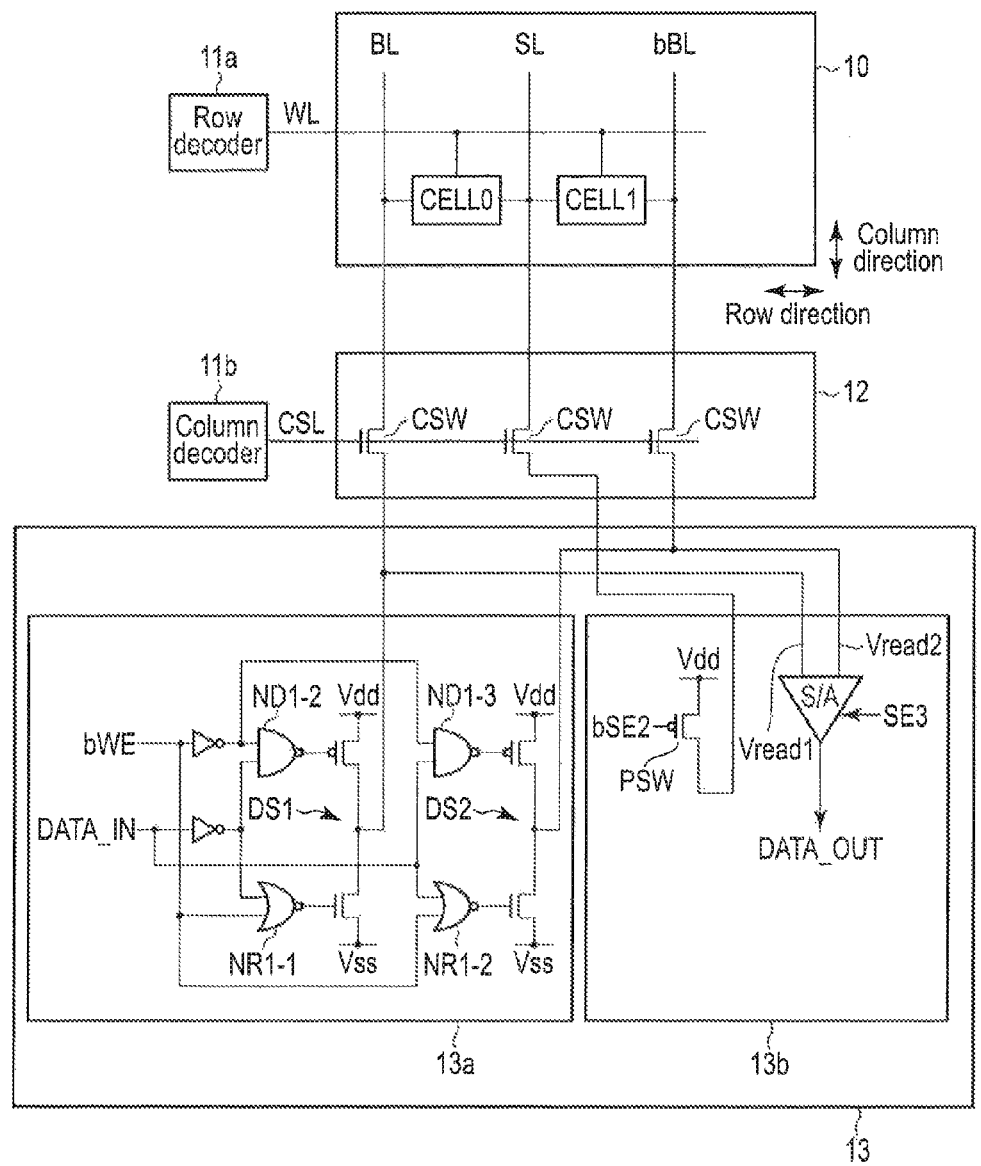
F I G. 11

※MTJ0 and MTJ1 are arranged symmetrically to Common source line SL

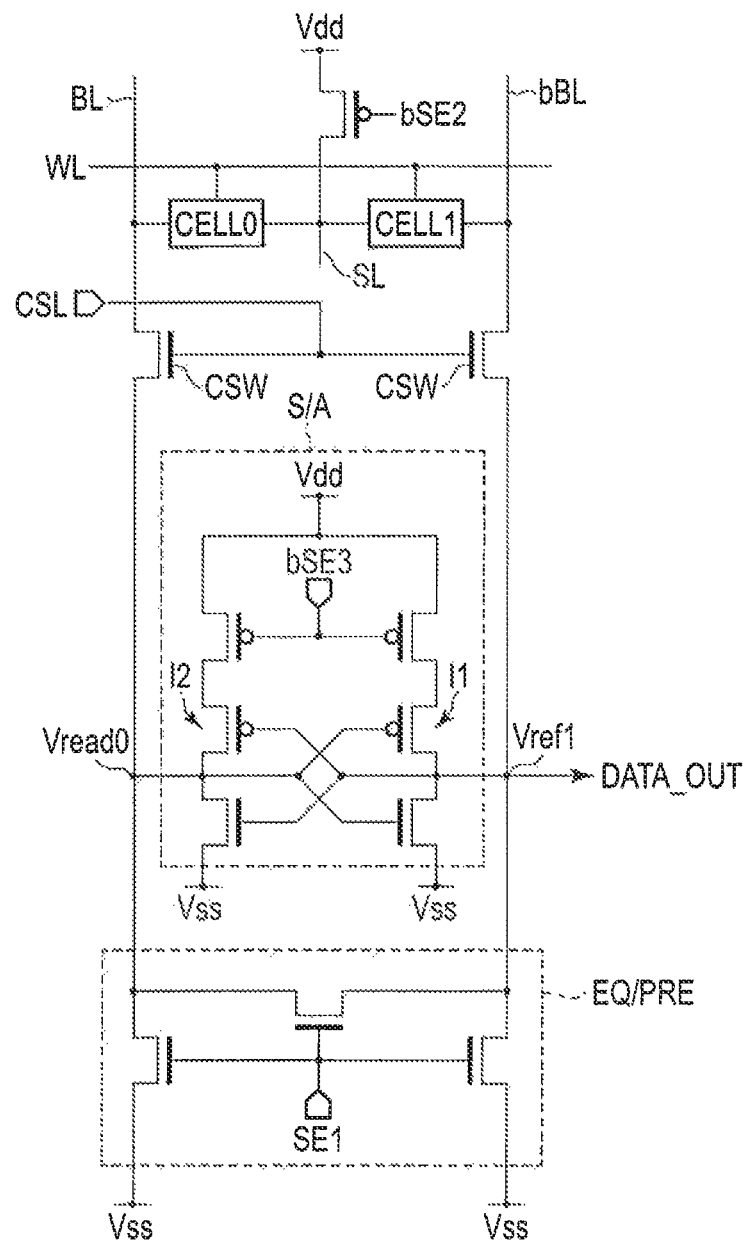
F I G. 14

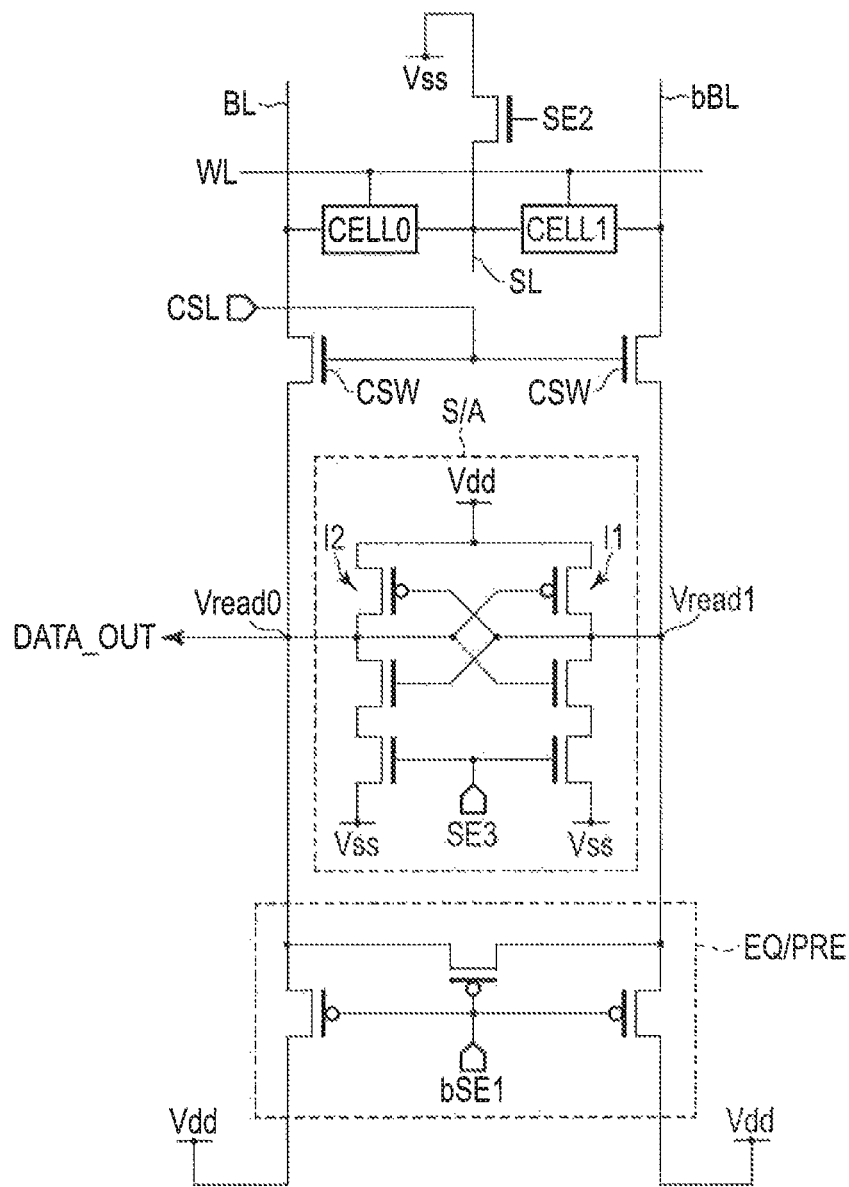
F I G. 15

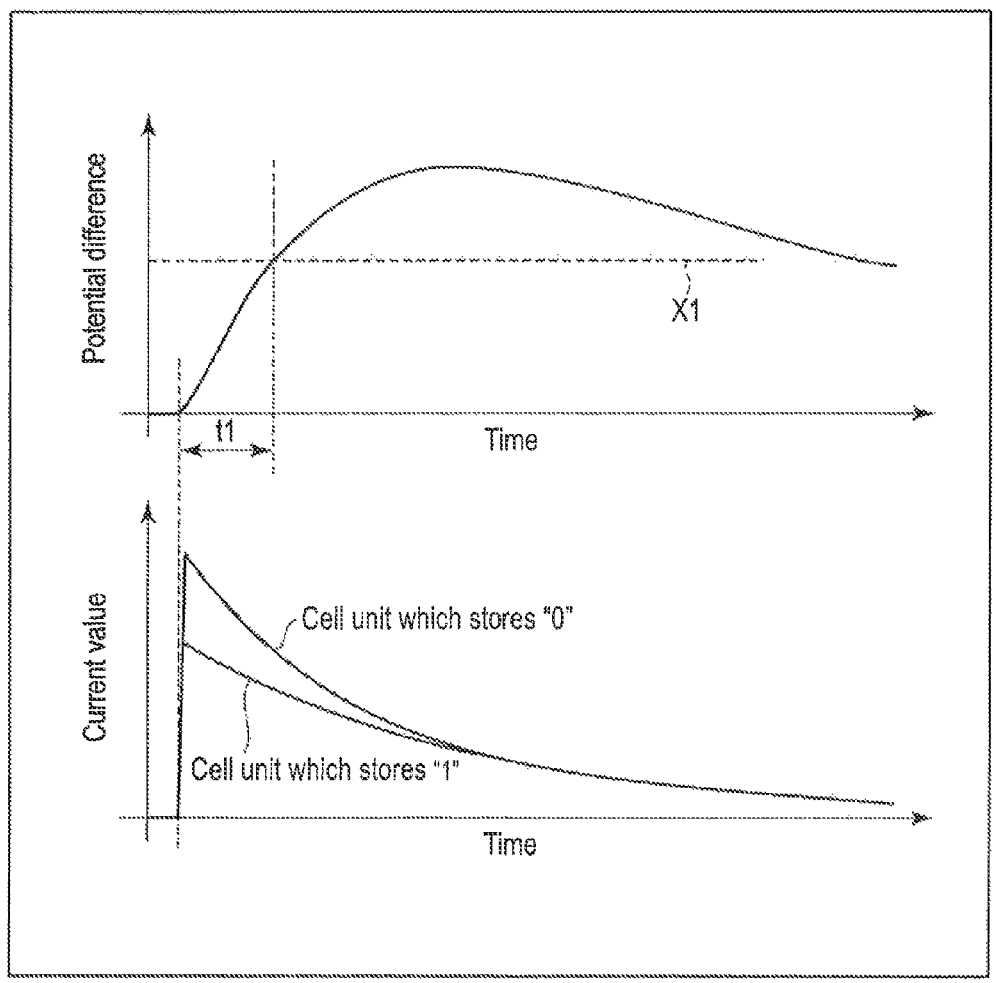
F I G. 16

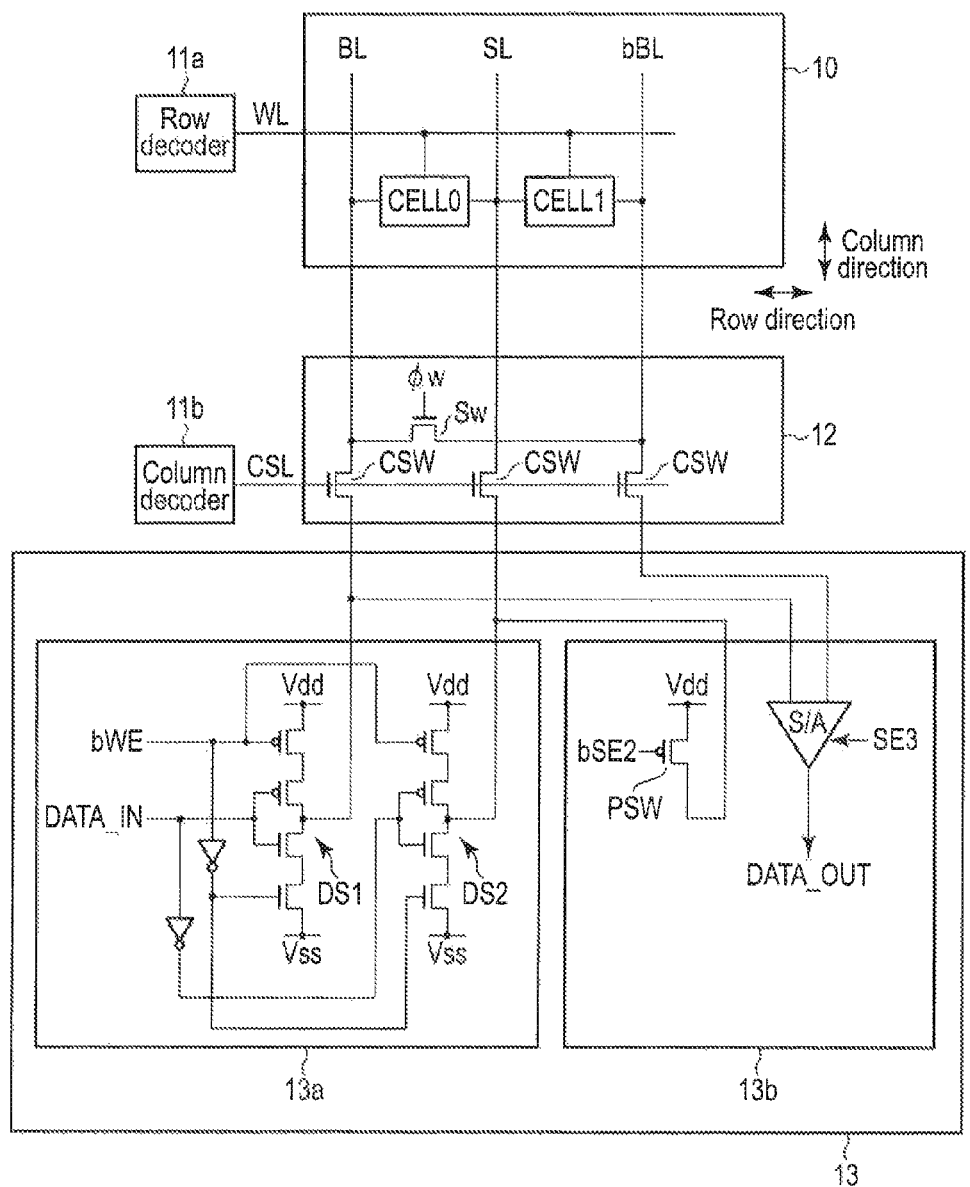
F I G. 20

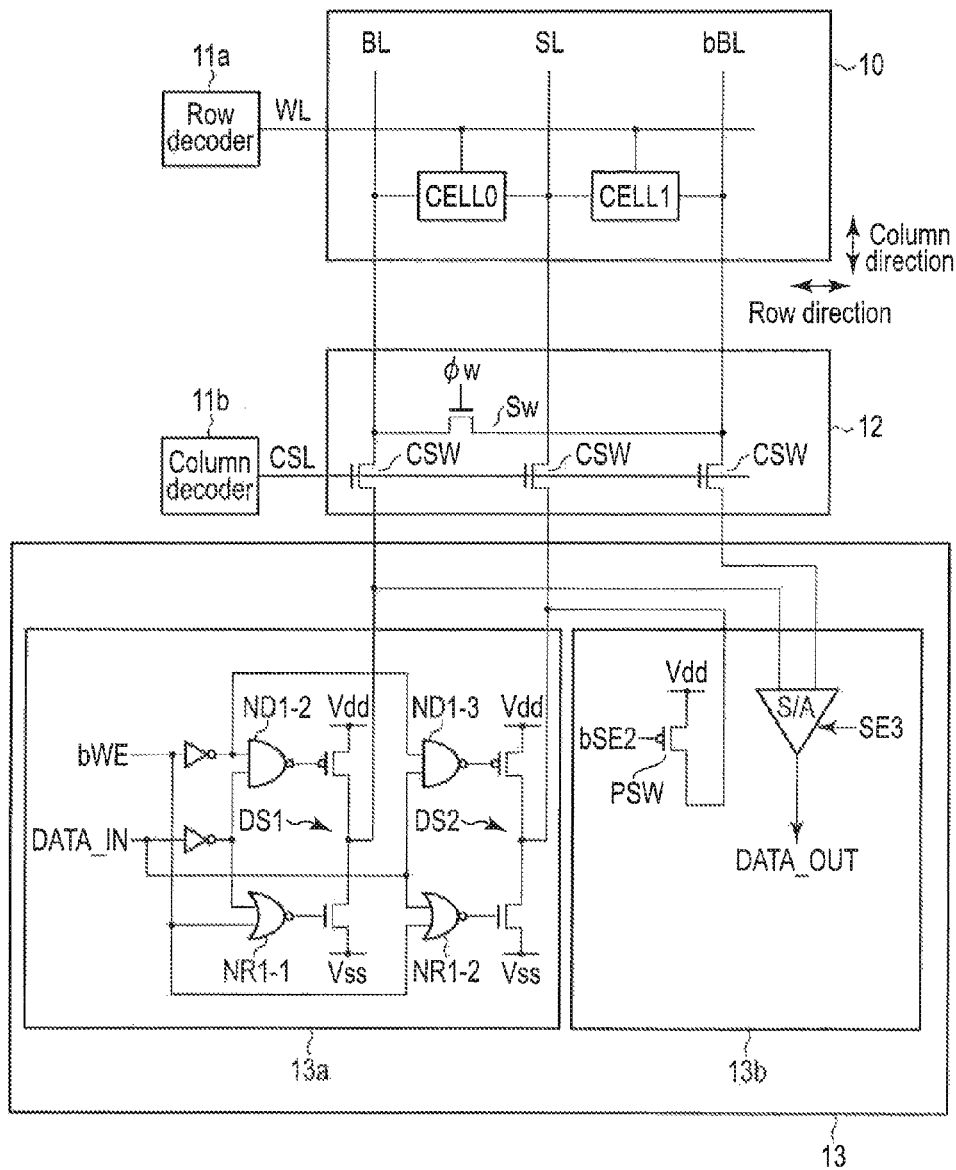
F I G. 21

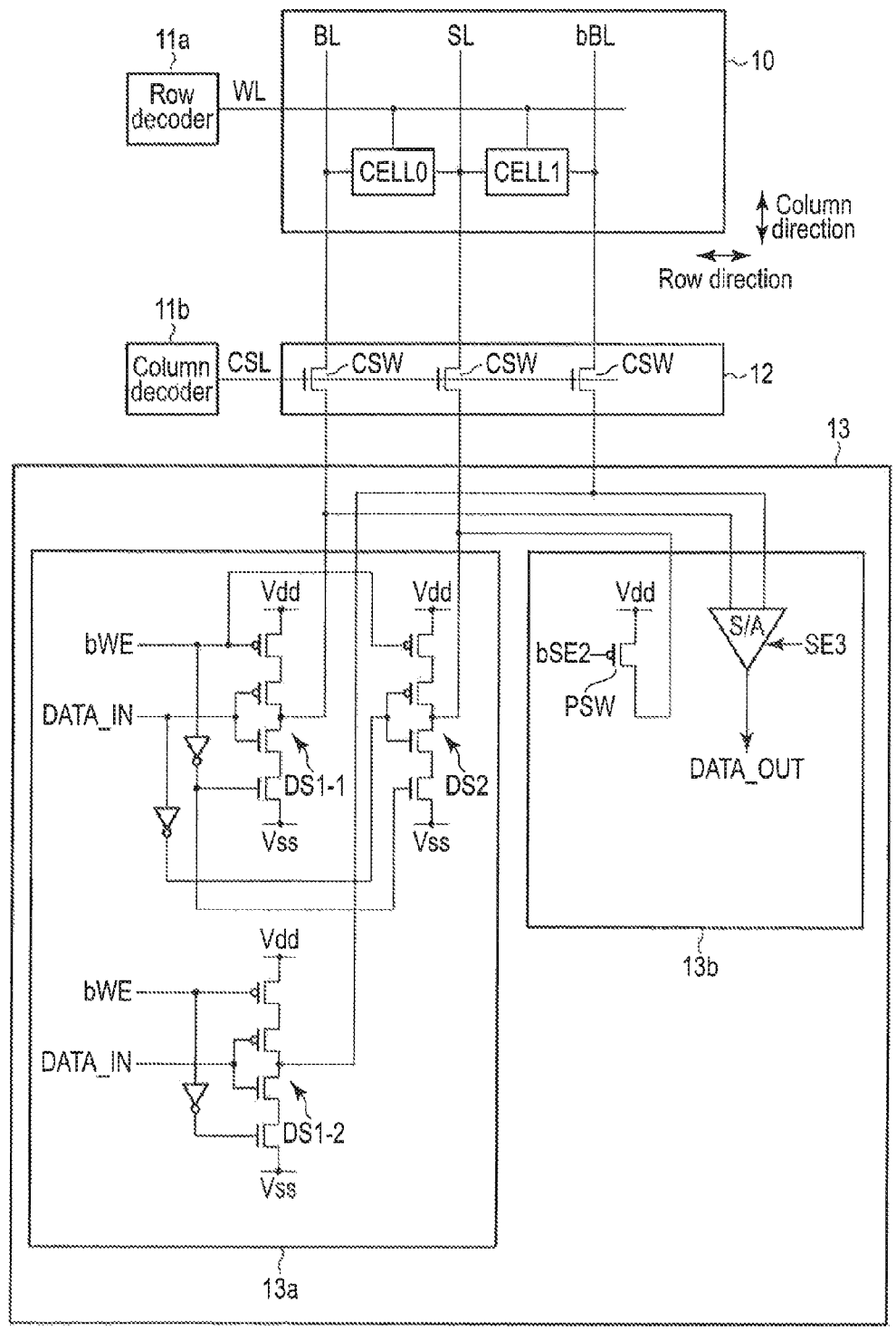
F I G. 22

※MTJ0 and MTJ1 are arranged asymmetrically to Common source line SL

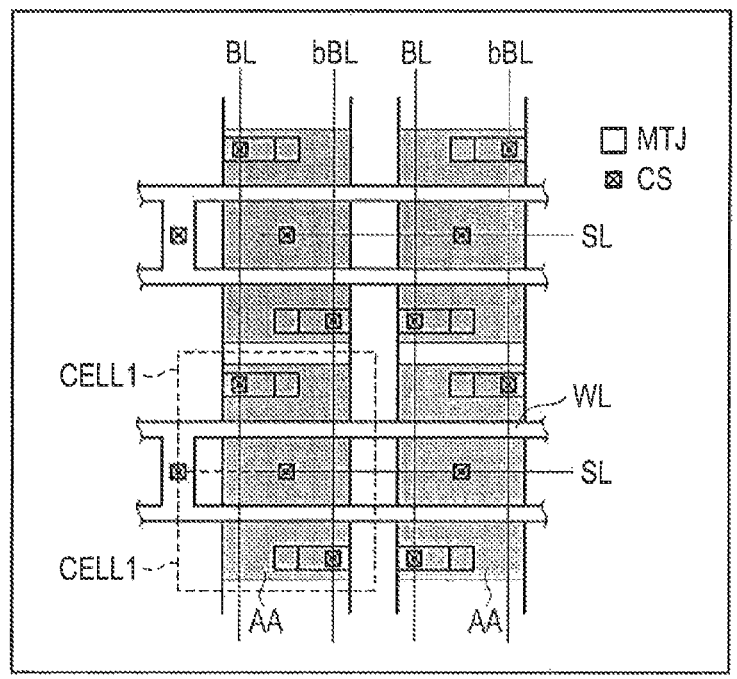
F I G. 26
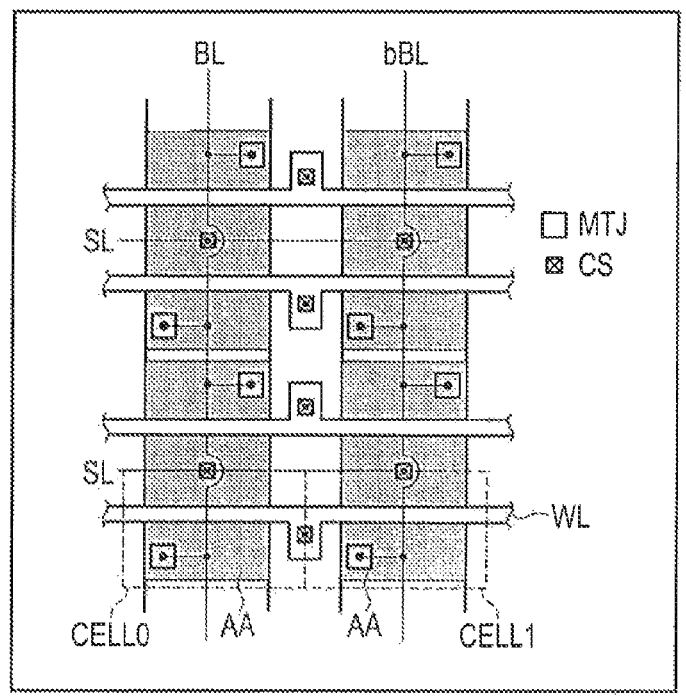
F I G. 27

MAGNETIC RANDOM ACCESS MEMORY

CROSS-REFERENCE TO RELATED APPLICATIONS

This application is based upon and claims the benefit of priority from Japanese Patent Application No. 2012-127409, filed Jun. 4, 2012, the entire contents of which are incorporated herein by reference.

FIELD

Embodiments described herein relate generally to a magnetic random access memory.

BACKGROUND

In a conventional read operation of a magnetic, random access memory, a method of passing a current from a sense amplifier to a magnetoresistive element, converting a current difference caused by the resistance of the magnetoresistive element into a difference of the voltage drop of a transistor in the sense amplifier, and amplifying the difference or the like is adopted.

According to the method, it is necessary to continue to pass the current to the magnetoresistive element until the current value stabilizes during reading, posing a problem of a longer read operation and higher power consumption. The problem may become a critical defect when the magnetic random access memory is used as a cache memory of a low-power consuming processor.

Also according to this method, a difference between a reference current and a current dependent on the resistance value (high resistance value/low-resistance value) of the magnetoresistive element becomes a read margin unchanged. Thus, noise produced in the timing (instantaneous value) of converting a current value into a voltage value greatly affects the read operation. If it is assumed that, for example, the current value is on the order of 10 µA and the on resistance of a transistor is a few kΩ, the read margin becomes about 5 mV and an extremely precise sense amplifier that consumes large power and has a large size will be needed to sense such a read margin.

Further, if a case when the magnetic random access memory is used as a cache memory of a high-speed reading processor is assumed, the above conventional read operation causes a problem that power consumption during reading and latency (delay time) become large. Because read access occurs very frequently in the cache memory of the processor, the problem significantly deteriorates processor's performance.

BRIEF DESCRIPTION OF THE DRAWINGS

FIGS. 2 and 3 are diagrams showing a memory cell array, write circuit, and read circuit;

FIG. 6 is a diagram showing a sense amplifier;

FIG. 8 is a diagram showing the sense amplifier;

FIGS. 10 and 11 are diagrams showing a memory cell array, write circuit, and read circuit;

FIGS. 14 and 15 are diagrams showing the sense amplifier;

FIG. 16 is a diagram showing a potential difference and current value by a voltage sensing method;

FIGS. 20 to 22 are diagrams showing the memory cell array, write circuit, and read circuit;

FIGS. 26 to 29 are diagrams showing a layout of memory cells.

DETAILED DESCRIPTION

In general, according to one embodiment, a magnetic random access memory comprises: first and second bit lines; a common source line; a first cell unit including a first magnetoresistive element connected between the first bit and the common source line; a second cell unit including a second magnetoresistive element connected between the second bit and the common source line; a write circuit to write complementary data to the first and second magnetoresistive elements in the first and second cell units; a read circuit to read the complementary data from the first and second magnetoresistive elements in the first and second cell units; and a control circuit that is configured to: change the first and second, bit lines to a floating state after setting the first and second bit lines to a first potential; change a potential of the first bit line in the floating state to a value in accordance with a resistance value of the first magnetoresistive element and a potential of the second bit line in the floating state to a value in accordance with a resistance value of the second magnetoresistive element by setting the common source line to a second potential higher than the first potential; and control the read circuit so that the read circuit detects a difference between the value of the potential of the first bit line in the floating state and the value of the potential of the second bit line in the floating state.

Embodiments will be described below with reference to the drawings.

[General View]

Figure 1:
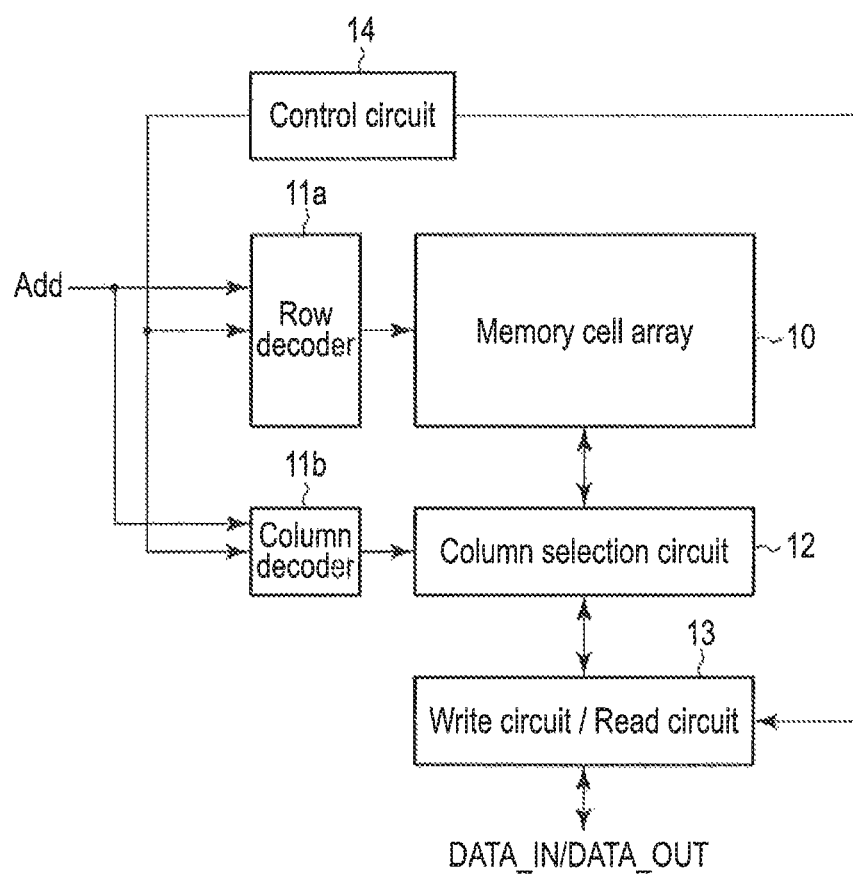
FIG. 1 is a diagram showing a magnetic random access memory.

FIG. 1 shows principal portions of a magnetic random access memory.

Memory cell array 10 includes an array of magnetoresistive elements (memory cells). Row decoder 11a and column decoder 11b randomly access magnetoresistive elements in memory cell array 10 based on address signal Add.

Column selection switch 12 has a role to electrically connect memory cell array 10 and write circuit/read circuit 13 based on a signal from column decoder 11b.

Write circuit/read circuit 13 carried out writing data DATA_IN to memory cell array 10 and reading data DATA_OUT from memory cell array 10.

Control circuit 14 controls operations of row decoder 11a, column decoder 11b, and write circuit/read circuit 13.

First Embodiment

The present embodiment relates to a magnetic random access memory in a 1-cell/1-bit structure.

FIG. 2 showing a memory cell array, write circuit, and read circuit.

Cell unit CELL in memory cell array 10 includes magnetoresistive element MTJ and selection transistor (FET) T connected in series. A gate terminal of the selection transistor is connected to word line WL. Word line WL extends in a row direction and one end thereof is connected to row decoder 11a.

One end of cell unit CELL is connected to bit line BL and the other end is connected to bit line bBL. Both of bit lines BL, bBL extend in a column direction and one end thereof is connected to write circuit 13a and read circuit 13b via column selection transistor (FET) CSW.

The gate terminal of column selection transistor CSW is connected to column decoder 11b. ON/OFF of column selection transistor CSW is controlled by column selection signal CSL from column decoder 11b.

Write circuit 13a includes write drivers/sinkers DS1, DS2. Write driver/sinker DS1 is connected to one end of bit line BL and write driver/sinker DS2 is connected to one end of bit line bBL.

Further, write drivers/sinkers DS1, DS2 include, for example, two P channels FET and two N channels FET connected in series between power terminal Vdd and ground terminal Vss.

When, for example, write enable signal WE is "H" and inversion signal bWE thereof is "L", drivers/sinkers DS1, DS2 are activated.

Therefore, a write current in a direction from driver/sinker DS2 toward driver/sinker DS1 flows to cell unit CELL when write data DATA_IN is "1" and a write current, in a direction from driver/sinker DS1 toward driver/sinker DS2 flows to cell unit CELL when write data DATA_IN is "0".

Also when, for example, write enable signal WE is "L" and inversion signal bWE thereof is "H", drivers/sinkers DS1, DS2 are inactivated.

Read circuit 13b includes, for example, power transistor (FET) PSW connected to bit line BL and sense amplifier S/A connected to bit line bBL.

However, the physical relationship of power transistor PSW and sense amplifier S/A may be reversed. That is, power transistor (FET) PSW may be connected to bit line bBL and sense amplifier S/A may be connected to bit line BL.

For example, power transistor PSW is turned on when activation signal bSE2 is "L" and sense amplifier S/A is activated when activation signal SE3 is "H".

Therefore, read data DATA_OUT can be read from the magneto-resistive element in cell unit CELL by, for example, detecting changes of the potential of bit line BL in a floating state by using sense/amplifier S/R.

The reading technology (the accumulated charge method or voltage sensing method) will be described in detail later.

In the present example, it is assumed that data "1" corresponds to logic "H" and data "0" corresponds to logic "L", but the relationship between data "1"/"0" and logic "H"/"L" is not limited to the above example and a reversed relationship may also be adopted.

The magnetoresistive element in cell unit CELL stores one bit (binary) of a high-resistance state and a low-resistance state. The high-resistance state is assumed to be a "1" state and the low-resistance state is assumed to be a "0" state. In the initial state of the magnetic random access memory, all magnetoresistive elements are assumed to be in the "1" state.

According to the present example, the write drivers/sinkers DS1, DS2 include two P channels FET and two N channels FET and thus, the configuration of a control circuit that controls ON/OFF thereof advantageously becomes simple. However, two FETs are arranged between power terminal Vdd and bit line BL and the voltage drop increases and thus, if the voltage drop should be decreased, it is desirable to adopt, the example shown in FIG. 3.

FIG. 3 showing the memory cell array, write circuit, and read circuit.

The present example is different from the example shown in FIG. 2 in the configuration of write circuit 13a.

Write circuit 13a includes write drivers/sinkers DS1, DS2. Write driver/sinker DS1 is connected to one end of bit line BL and write driver/sinker DS2 is connected to one end of bit line bBL.

Further, write drivers/sinkers DS1, DS2 include, for example, P channel FET and N channel FET connected in series between power terminal Vdd and ground terminal Vss.

Then, when write enable signal WE is "H" and inversion signal bWE thereof is "L", NAND gate circuits ND1-2, ND1-3 and NOR gate circuits NR1-1, NR1-2 output output signals in accordance with the value of write data DATA_IN.

When, for example, write data DATA_IN is "1", the output signal of NAND gate circuit ND1-2 and that of NOR gate circuit NR1-1 are both "1". Thus, write driver/sinker DS1 connects bit line BL to ground terminal Vss. Further, the output signal of NAND gate circuit. ND1-3 and that of NOR gate circuit NR1-2 are both "0". Thus, write driver/sinker DS2 connects bit line bBL to power terminal Vdd.

Therefore, a write current in a direction from driver/sinker DS2 (bit line bBL) toward driver/sinker DS1 (bit line BL) flows to cell unit CELL.

When, for example, write data DATA_IN is "0", the output signal of NAND gate circuit ND1-2 and that of NOR gate circuit NR1-1 are both "0". Thus, write driver/sinker DS1 connects bit line BL to power terminal Vdd. Further, the output signal of NAND gate circuit ND1-3 and that of NOR gate circuit NR1-2 are both "1". Thus, write driver/sinker DS2 connects bit line bBL to ground terminal Vss.

Therefore, a write current in a direction from driver/sinker DS1 (bit line BL) toward driver/sinker DS2 (bit line bBL) flows to cell unit CELL.

Figure 4:
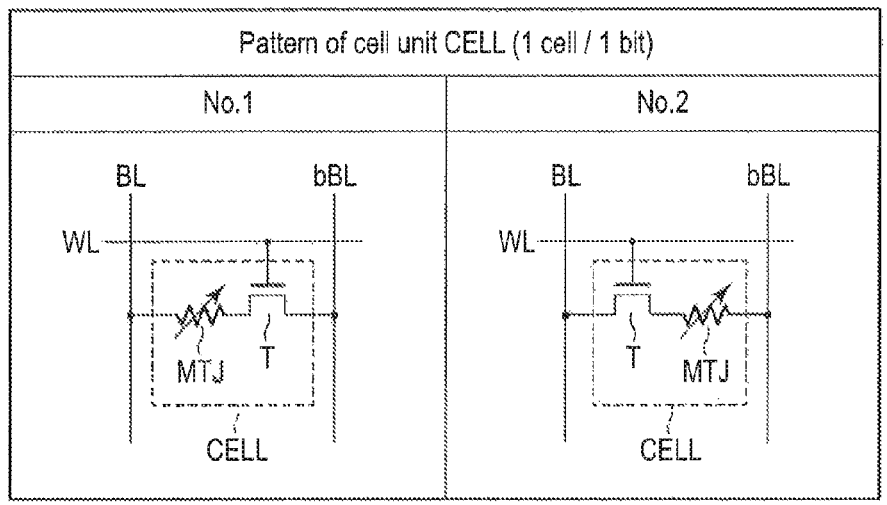
FIG. 4 is a diagram showing patterns of a cell unit.

FIG. 4 shows patterns of a cell unit in a 1-cell/1-bit structure.

One cell unit CELL includes one magnetoresistive element MTJ and one selection transistor (FET) T connected in series.

In a first pattern (No. 1), magnetoresistive element (memory cell) MTJ is arranged on the side of bit line BL and selection transistor (switch element) T is arranged on the side of bit line bBL. In a second pattern (No. 2), magnetoresistive element (memory cell) MTJ is arranged on the side of bit line bBL and selection transistor (switch element) T is arranged on the side of bit line BL.

In the present example, cell unit CELL may have any of the first and second patterns.

Figure 5:
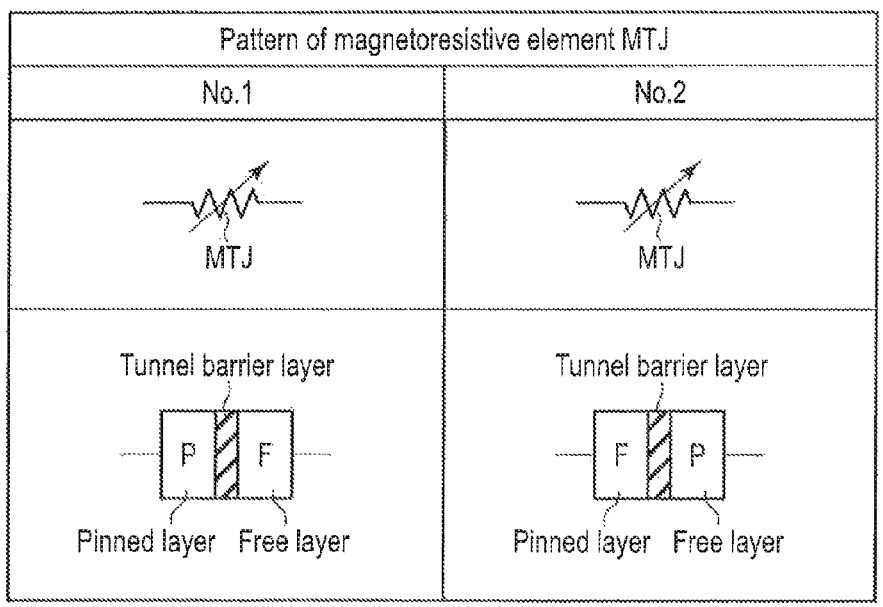
FIG. 5 is a diagram showing patterns of a magnetoresistive element.

FIG. 5 shows patterns of a magnetoresistive element.

The example relates to arrangement of a pinned (reference) layer and a free layer of magnetoresistive element MTJ inside cell unit CELL in the 1-cell/l-bit structure in FIG. 4.

Each of magnetoresistive elements MTJ includes pinned layer P whose magnetization state is invariant and free layer F whose magnetization state is variant.

In the first pattern (No. 1), pinned layer P of magnetoresistive element MTJ is arranged on the side of bit line BL in each of the first and second patterns (No. 1 and No. 2) in FIG. 4 and free layer F of magnetoresistive element MTJ is arranged on the side of bit line bBL in each of the first and second patterns (No. 1 and No. 2) in FIG. 4.

In the second pattern (No. 2), pinned layer P of magnetoresistive element MTJ is arranged on the side of bit line bBL in each of the first and second patterns (No. 1 and No. 2) in FIG. 4 and free layer F of magnetoresistive element MTJ is arranged on the side of bit line BL in each of the first and second patterns (No. 1 and No. 2) in FIG. 4.

In the present example, magnetoresistive element MTJ may have any of the first and second patterns.

FIG. 6 shows a configuration example of a sense amplifier.

Sense, amplifier S/A adopts the differential voltage sensing method that compares potential Vread of bit line BL and reference potential Vref. The present example also adopts the discharge type that pre-discharges bit lines BL, DBL before a sensing operation.

Sense amplifier S/A includes first inverter I1 whose input terminal is connected to bit line BL and whose output terminal is connected to bit line DBL and second inverter I2 whose input terminal is connected to bit line DBL and whose output terminal is connected to bit line BL.

Sense amplifier S/A is activated by activation signal bSE3. For example, when activation signal bSE3 is "L", sense amplifier S/A is activated.

Equalize/pre-discharge circuit EQ/PRE is connected, between two bit lines BL, DBL to equalize the potential of bit lines BL, DBL with, for example, ground potential Vss and also pre-discharge bit lines BL, DBL.

In the present example, equalize/pre-discharge circuit EQ/PRE sets bit lines BL, DBL to ground potential Vss by discharging bit lines BL, DBL.

Reference unit REF is a unit to generate reference potential Vref of sense amplifier S/A.

Reference unit REF includes, for example, a magnetoresistive element and a selection transistor (FET) connected in series. The gate terminal of the selection transistor is connected to word line WL. One end of reference unit REF is connected to bit line DBL and the other end is connected to bit line bDBL.

Cell unit CELL, power transistor PSW, and column selection transistor CSW are the same as those in FIG. 2 and thus, the description thereof is omitted here.

In the present example, data in the magnetoresistive element (memory cell) is read by the accumulated charge method (voltage sensing method) using the sense amplifier in FIG. 6.

According to the voltage sensing method in the present example, bit line BL is pre-discharged to set to a first potential (for example, ground potential Vss) before being changed to a floating state on the side of cell unit CELL. By setting bit line bBL to a second potential (for example, power potential Vdd) higher than the first potential, the potential of bit line BL in a floating state is changed to a value in accordance with the resistance value of the magnetoresistive element.

Similarly, bit line DBL is pre-discharged to set to the first potential (for example, ground potential Vss) before being changed to a floating state on the side of reference unit REF. By setting bit line bDBL to the second potential (for example, power potential Vdd) higher than the first potential, the potential of bit line DBL in a floating state is changed to a value in accordance with the resistance value of the magnetoresistive element.

Then, a difference between potential (read potential) Vread of bit line BL in a floating state and potential (reference potential) Vref of bit line DBL in a floating state is detected by using sense amplifier S/A and the difference is amplified to output read data DATA_OUT.

According to the voltage sensing method, like the current sensing method, the current flowing through cell unit CELL and reference unit REF can be adjusted by adding a clamp circuit.

Figure 7:
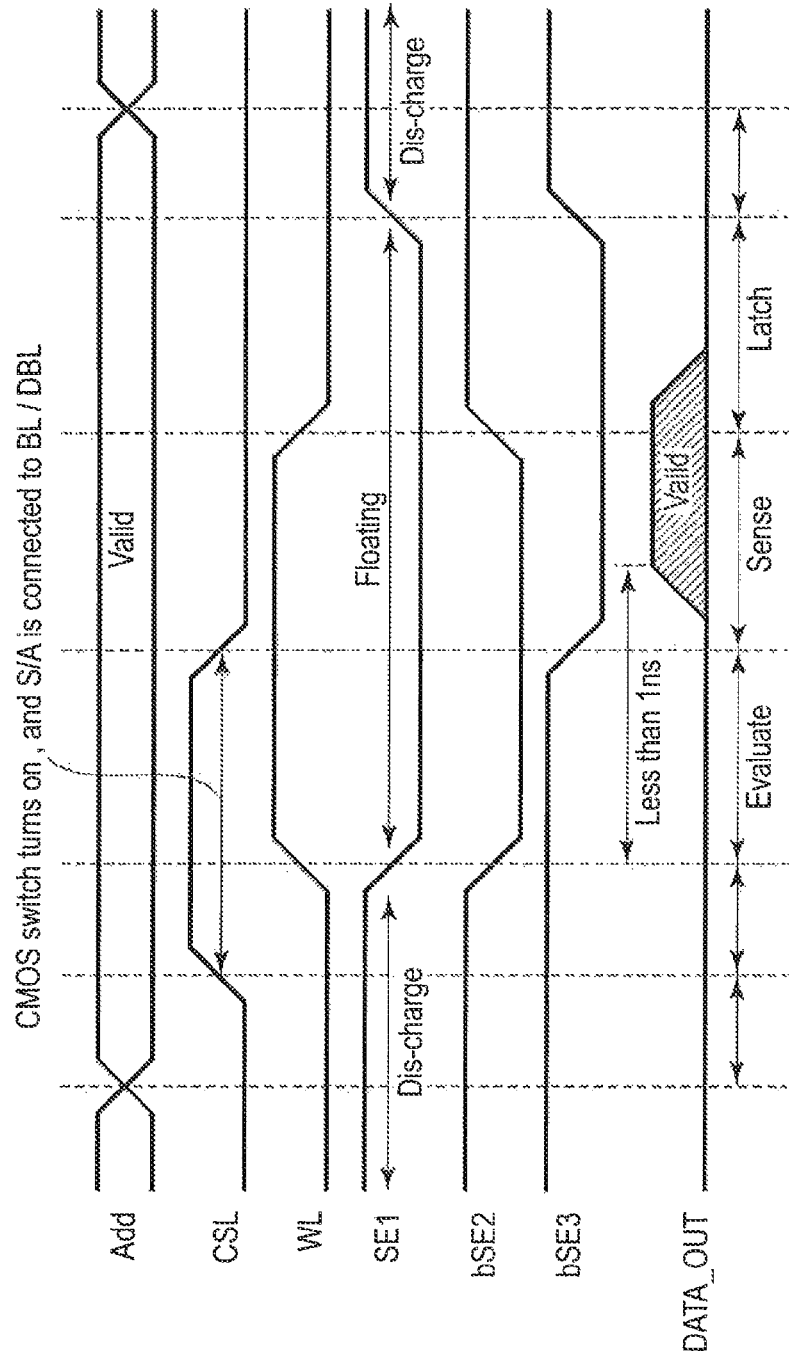
FIG. 7 is a waveform chart showing read timing.

FIG. 7 shows a timing waveform chart when reading is carried out by the voltage sensing method using the sense amplifier in FIG. 6.

First, bit lines BL, DBL are discharged to set to ground potential Vss by setting activation signal SE1 to "H". Address signals (a row address signal and a column address signal) Add are input during the discharge period.

Further, column selection signal CSL is set to "H" to electrically connect bit lines BL, DBL to sense amplifier S/A in an inactive state.

Then, by setting word line WL to "H", a state in which bit line bBL is electrically connected to bit line BL via cell unit CELL and a state in which bit line bDBL is electrically connected to bit line DBL via reference unit REF are formed.

Further, by setting activation signal SE1 to "L", bit lines BL, DBL are changed to a floating state. Further, by setting activation signal bSE2 to "L", bit lines bBL, bDBL are set to power potential Vdd.

As a result, a current flows from bit line bBL toward bit line BL to charge parasitic capacity of bit line BL. Similarly, a current flows from bit line bDBL toward bit line DBL to charge parasitic capacity of bit line DBL.

At this point, the rate of charging the parasitic capacity of bit line BL changes in accordance with the resistance value of the magnetoresistive element in cell unit CELL and the rate of charging the parasitic capacity of bit line DBL changes in accordance with the resistance value of the magnetoresistive element in reference unit REF.

Therefore, if, for example, the magnetoresistive element in cell unit CELL stores "1" and is in a high-resistance state, the rate of charging the parasitic capacity of bit line BL becomes slower and if the magnetoresistive element in cell unit CELL stores "0" and is in a low-resistance state, the rate of charging the parasitic capacity of bit line BL becomes faster.

On the other hand, if the resistance value of the magnetoresistive element in reference unit REF is set to an intermediate value between "1" (high-resistance state) and "0" (low-resistance state), the rate of charging the parasitic capacity of bit line DBL becomes an intermediate value between the charging rate when the magnetoresistive element in cell unit CELL holds "1" and the charging rate when magnetoresistive element holds "0".

That is, data of the magnetoresistive element in cell unit CELL can be read by sensing a difference between the change of potential (accumulated amount of charge) of bit line BL and that of potential (accumulated amount of charge) of bit line DBL by sense amplifier S/A.

The period between the start of charging bit lines BL, DBL and the activation of sense amplifier S/A can be made sufficiently shorter than that by the current sensing method. For example, the period can be made less than 1 nsec by the voltage sensing method according to the present embodiment.

Incidentally, sense amplifier S/A is activated by activation signal bSE3 being set to "L".

In the current sensing method, the rate of change of the current value is determined by the MR ratio (magnetoresistive ratio) of the magnetoresistive element and thus, the potential difference that can be generated by the method is about 5 mV. Therefore, it is necessary for the sense amplifier to amplify such a tiny potential difference. In the voltage sensing method, by contrast, charges are accumulated and thus, a potential difference of 50 mV or more can be created and the design of the sense amplifier can significantly be simplified.

Also while sensing by the sense amplifier is not possible until a fixed period passes after a current being started to flow to the magnetoresistive element so that the current value stabilizes in the current sensing method, there is no need to wait for saturation of the current value because the accumulation of charge is started immediately after the current starts to flow into the magnetoresistive element.

Thus, when compared with the current sensing method in which a sensing period delay is caused by an RC delay, the voltage sensing method can shorten the period between the start of passing a current to the magnetoresistive element and the start of a sensing operation.

Further, the voltage sensing method is a method by which data is read based on a potential difference (accumulated value of charge) and thus, both the read margin and speed can be improved when compared with the current sensing method in which instantaneous values of current are compared.

In the present example, the timing when activation signal SE1 is set to "L" and the timing when activation signal bSE2 is set to "L" are the same, but instead, the timings may mutually be shifted.

The timing when word line WL is set to "H" may be prior or subsequent to the timing when activation signal SE1 is set to "L" and the timing when activation signal bSE2 is set to "L".

FIG. 8 shows a configuration example of the sense amplifier.

Sense amplifier S/A adopts the differential voltage sensing method that compares potential Vread of bit line BL and reference potential Vref. The present example also adopts the pre-charge type that pre-charges bit lines BL, DBL before a sensing operation.

Sense amplifier S/A includes first inverter I1 whose input terminal is connected to bit line BL and whose output terminal is connected to bit line DBL and second inverter I2 whose input terminal is connected to bit line DBL and whose output terminal is connected to bit line BL.

Sense amplifier S/A is activated by activation signal SE3. For example, when activation signal SE3 is "H", sense amplifier S/A is activated.

Equalize/pre-charge circuit EQ/PRE is connected between two bit lines BL, DBL to equalize the potential of bit lines BL, DBL with, for example, power potential Vdd and also precharge bit lines BL, DBL.

In the present example, equalize/pre-charge circuit. EQ/PRE sets bit lines BL, DBL to power potential Vdd by pre-charging bit lines BL, DBL.

Reference unit REF is a unit to generate reference potential Vref of sense amplifier S/A.

Reference unit REF includes, for example, a magnetoresistive element and a selection transistor (FET) connected in series. The gate terminal of the selection transistor is connected to word line WL. One end of reference unit REF is connected to bit line DBL and the other end is connected to bit line bDBL.

Cell unit CELL, power transistor PSW, and column selection transistor CSW are the same as those in FIG. 2 and thus, the description thereof is omitted here.

In the present example, data in the magnetoresistive element (memory cell) is read by the accumulated charge method (voltage sensing method) using the sense amplifier in FIG. 8.

According to the voltage sensing method in the present example, bit line BL is pre-charged to set to the first potential (for example, power potential Vdd) before being changed to a floating state on the side of cell unit CELL. By setting bit line bBL to the second potential (for example, ground potential Vss) lower than the first potential, the potential of bit line BL in a floating state is changed to a value in accordance with the resistance value of the magnetoresistive element.

Similarly, bit line DBL is pre-charged to set to the first potential (for example, power potential Vdd) before being changed to a floating state on the side of reference unit REF. By setting bit line bDBL to the second potential (for example, ground potential Vss) lower than the first potential, the potential of bit line DBL in a floating state is changed to a value in accordance with the resistance value of the magnetoresistive element.

Then, a difference between potential (read potential) Vread of bit line BL in a floating state and potential, (reference potential) Vref of bit line DBL in a floating state is detected by using sense amplifier S/A and the difference is amplified to output read data DATA_OUT.

According to the voltage sensing method, like the current sensing method, the current flowing through cell unit CELL and reference unit REF can be adjusted by adding a clamp circuit.

Figure 9:
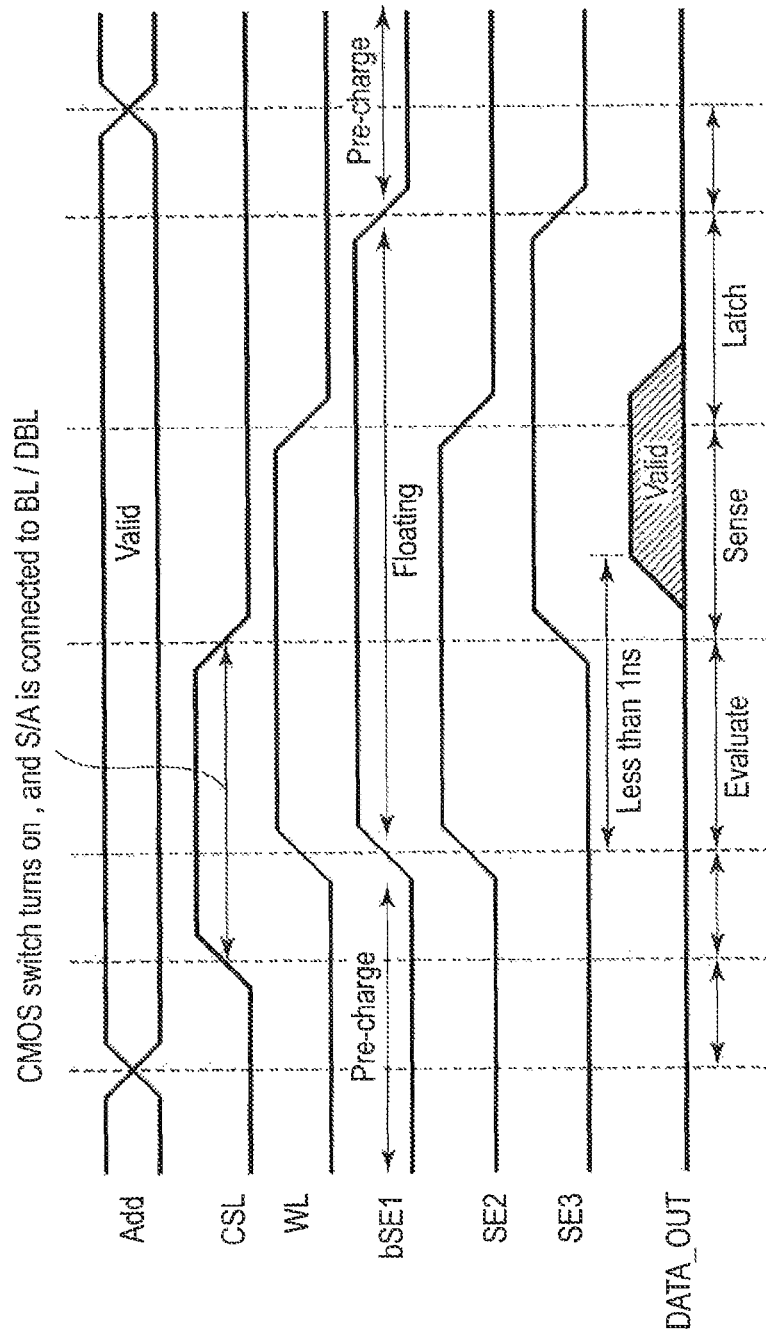
FIG. 9 is a waveform chart showing the read timing.

FIG. 9 shows a timing waveform chart when reading is carried out by the voltage sensing method using the sense amplifier in FIG. 8.

First, by setting activation signal bSE1 to "L", bit lines BL, DBL are set to power potential Vdd. Address signals (a row address signal and a column address signal) Add are input during the pre-charge period.

Further, column selection signal CSL is set to "H" to electrically connect bit lines BL, DBL to sense amplifier S/A in an inactive state.

Then, by setting word line WL to "H", a state in which bit line bBL is electrically connected to bit line BL via cell unit CELL and a state in which bit line bDBL is electrically connected to bit line DBL via reference unit REF are formed.

Further, by setting activation signal bSE1 to "H", bit lines BL, DBL are changed to a floating state. Further, by setting activation signal SE2 to "H", bit lines bBL, bDBL are set to ground potential Vss.

As a result, a current flows from bit line BL toward bit line bBL to discharge parasitic capacity of bit line BL. Similarly, a current flows from bit line DBL toward bit line bDBL to discharge parasitic capacity of bit line DBL.

At this point, the rate of discharging the parasitic capacity of bit line BL changes in accordance with the resistance value of the magnetoresistive element in cell unit CELL and the rate of discharging the parasitic capacity of bit line DBL changes in accordance with the resistance value of the magnetoresistive element in reference unit REF.

Therefore, if, for example, the magnetoresistive element in cell unit CELL stores "1" and is in a high-resistance state, the rate of discharging the parasitic capacity of bit line BL becomes slower and if the magnetoresistive element in cell unit CELL stores "0" and is in a low-resistance state, the rate of discharging the parasitic capacity of bit line BL becomes faster.

On the other hand, if the resistance value of the magnetoresistive element in reference unit REF is set to an intermediate value between "1" (high-resistance state) and "0" (low-resistance state), the rate of discharging the parasitic capacity of bit line DBL becomes an intermediate value between the discharging rate when the magnetoresistive element in cell unit CELL holds "1" and the discharging rate when magnetoresistive element holds "0".

That is, data of the magnetoresistive element in cell unit CELL can be read by sensing a difference between the change of potential (accumulated, amount of charge) of bit line BL and that of potential (accumulated amount of charge) of bit line DBL by sense amplifier S/A.

The period between the start of discharging bit lines BL, DBL and the activation of sense amplifier S/A can be made sufficiently shorter than that by the current sensing method. For example, the period can be made less than 1 nsec by the voltage sensing method according to the present embodiment.

Incidentally, sense amplifier S/A is activated by activation signal SE3 being set to "H".

In the current sensing method, the rate of change of the current value is determined by the MR ratio (magnetoresistive ratio) of the magnetoresistive element and thus, the potential difference that can be generated by the method is about 5 mV. Therefore, it is necessary for the sense amplifier to amplify such a tiny potential difference. In the voltage sensing method, by contrast, charges are accumulated and thus, a potential difference of 50 mV or more can be created and the design of the sense amplifier can significantly be simplified.

Also while sensing by the sense amplifier is not possible until a fixed period passes after a current being started to flow to the magnetoresistive element so that, the current value stabilizes in the current sensing method, there is no need to wait for saturation of the current value because the accumulation of charge is started immediately after the current starts to flow into the magnetoresistive element.

Thus, when compared with the current sensing method in which a sensing period delay is caused by an RC delay, the voltage sensing method can shorten the period between the start of passing a current to the magnetoresistive element and the start of a sensing operation.

Further, the voltage sensing method is a method by which data is read based on a potential difference (accumulated value of charge) and thus, both the read margin and speed can be improved when compared with the current sensing method in which instantaneous values of current are compared.

In the present example, the timing when activation signal bSE1 is set to "H" and the timing when activation signal SE2 is set to "H" are the same, but instead, the timings may mutually be shifted.

The timing when word line WL is set to "H" may be prior or subsequent to the timing when activation signal bSE1 is set to "H" and the timing when activation signal SE2 is set to "H".

Second Embodiment

The present embodiment relates to a magnetic random access memory in a 2-cell/1-bit structure.

Figure 10:
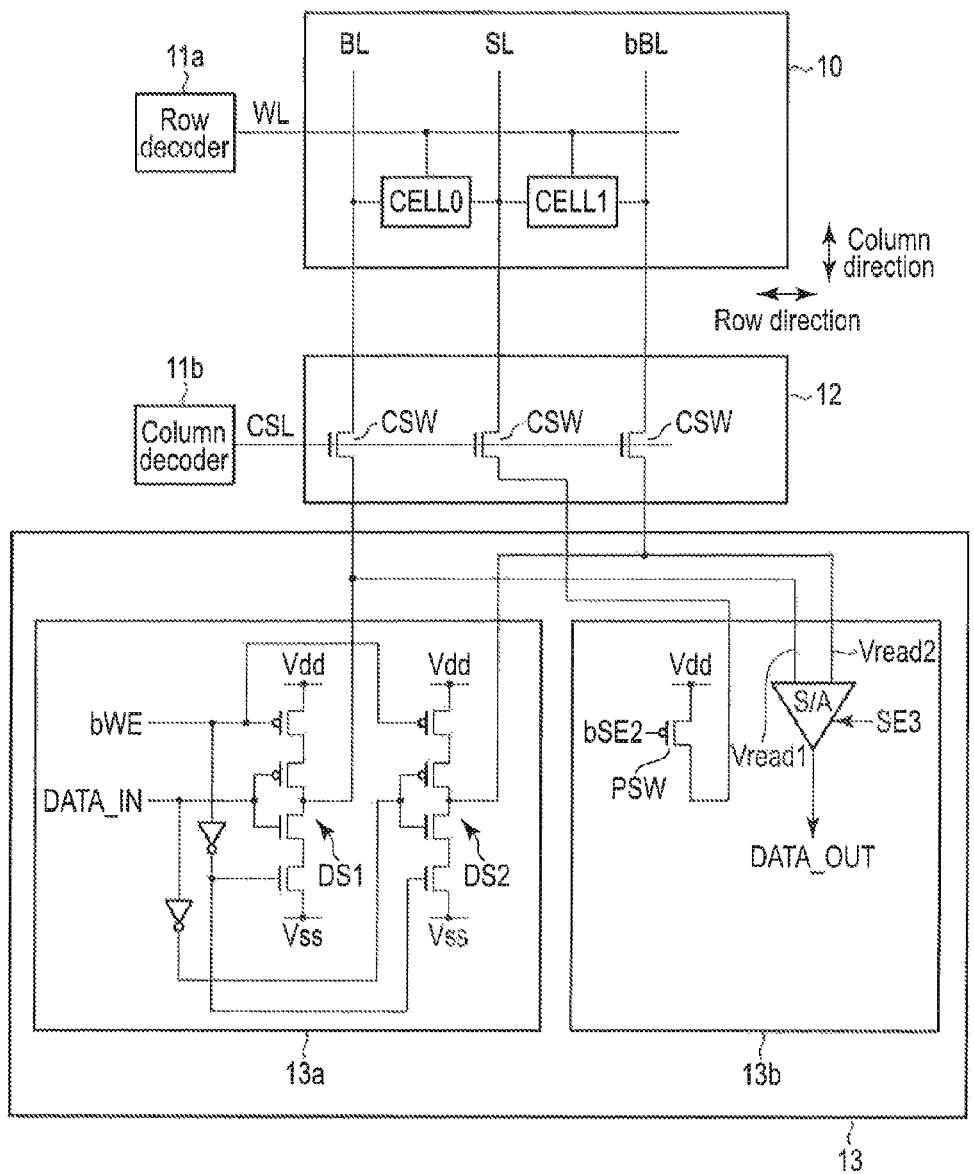

FIG. 10 shows a memory cell array, write circuit, and read circuit.

In the present embodiment, 1-bit data is stored by using two cell units CELL0, CELL1. Complementary data is stored in two cell units CELL0, CELL1.

Each of cell units CELL0, CELL1 in memory cell array 10 includes a magnetoresistive element and a selection transistor (FET) connected in series. A gate terminal of the selection transistor is connected to word line WL. Word line WL extends in the row direction and one end thereof is connected to row decoder 11a.

One end of cell unit CELL0 is connected to bit line BL and the other end is connected to common source line SL. One end of cell unit CELL1 is connected to bit line bBL and the other end is connected to common source line SL. Both of bit lines BL, bBL extend in the column direction and one end thereof is connected to write circuit 13a and read circuit 13b via column selection transistor (FET) CSW.

The gate terminal of column selection transistor CSW is connected to column decoder 11b. ON/OFF of column selection transistor CSW is controlled by column selection signal CSL from column decoder 11b.

Write circuit 13a includes write drivers/sinkers DS1, DS2. Write driver/sinker DS1 is connected to one end of bit line BL and write driver/sinker DS2 is connected to one end of bit line bBL.

Further, write drivers/sinkers DS1, DS2 include, for example, two channels FET and two N channels FET connected in series between power terminal Vdd and ground terminal Vss.

When, for example, write enable signal WE is "H" and inversion signal bWE thereof is "L", drivers/sinkers DS1, DS2 are activated.

Therefore, a write current in a direction from driver/sinker DS2 toward driver/sinker DS1 flows to cell units CELL0, CELL1 when write data DATA_IN is "1" and a write current in a direction from driver/sinker DS1 toward driver/sinker DS2 flows to cell units CELL0, CELL1 when, write data DATA_IN is "0".

Also when, for example, write enable signal WE is "L" and inversion signal bWE thereof is "H", drivers/sinkers DS1, DS2 are inactivated.

Read circuit 13b includes, for example, power transistor (FET) PSW connected to common source line SL and sense amplifier S/A connected to bit lines BL, bBL.

For example, power transistor PSW is turned, on when activation signal bSE2 is "L" and sense amplifier S/A is activated when activation signal SE3 is "E".

Therefore, read data DATA_OUT can be read from, the magnetoresistive element in cell units CELL0, CELL1 by, for example, detecting a potential difference of bit lines BL, bBL in a floating state by using sense/amplifier S/A.

Also in the present embodiment, like in the first embodiment, write circuit 13a can be modified. That is, when the voltage drop of the write drivers/sinkers in write circuit 13a should be made smaller, it is desirable to adopt the example shown in FIG. 11.

FIG. 11 shows the memory cell array, write circuit, and read circuit.

The present example is different from the example shown in FIG. 10 in the configuration of write circuit 13a. The configuration of write circuit 13a is the same as that shown in FIG. 3 and thus, the description thereof is omitted here.

When write enable signal WE is "H" and inversion signal bWE thereof is "L", NAND gate circuits ND1-2, ND1-3 and NOR gate circuits NR1-1, NR1-2 output output signals in accordance with the value of write data DATA_IN.

When, for example, write data DATA_IN is "1", the output signal of NAND gate circuit. ND1-2 and that of NOR gate circuit NR1-1 are both "1". Thus, write driver/sinker DS1 connects bit line BL to ground terminal Vss. Further, the output signal of NAND gate circuit ND1-3 and that of NOR gate circuit NR1-2 are both "0". Thus, write driver/sinker DS2 connects bit line bBL to power terminal Vdd.

Therefore, a write current in a direction from driver/sinker DS2 (bit line bBL) toward driver/sinker DS1 (bit line BL) flows to cell units CELL0, CELL1.

When, for example, write data DATA_IN is "0", the output signal of NAND gate circuit ND1-2 and that of NOR gate circuit NR1-1 are both "0". Thus, write driver/sinker DS1 connects bit line BL to power terminal Vdd. Further, the output signal of NAND gate circuit ND1-3 and that of NOR gate circuit NR1-2 are both "1". Thus, write driver/sinker DS2 connects bit line bBL to ground terminal Vss.

Therefore, a write current in a direction from driver/sinker DS1 (bit line BL) toward driver/sinker DS2 (bit line bBL) flows to cell units CELL0, CELL1.

Figure 12:
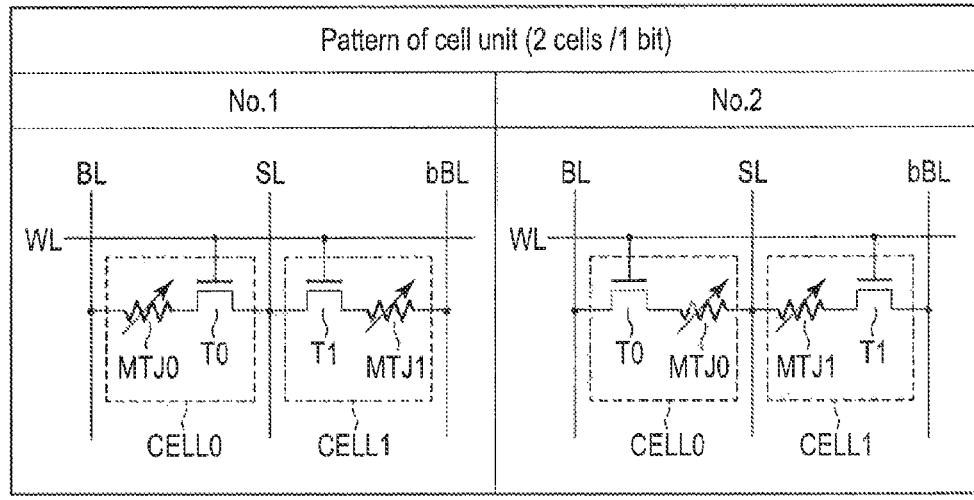
FIG. 12 is a diagram showing patterns of a cell unit.

FIG. 12 shows patterns of a cell unit in a 2-cell/1-bit structure.

Cell unit CELL0 includes magnetoresistive element MTJ0 and selection transistor (FET) T0 connected in series. Further, cell unit. CELL1 includes magnetoresistive element MTJ1 and selection transistor (FET) T1 connected in series.

In a first pattern (No. 1), magnetoresistive element (memory cell) MTJ0 is arranged on the side of bit line BL and selection transistor (switch element) T0 is arranged on the side of common source line SL in cell unit CELL0. In cell unit CELL1, magnetoresistive element MTJ1 is arranged on the side of bit line bBL and selection transistor T1 is arranged on the side of common source line SL.

In a second pattern (No. 2), magnetoresistive element (memory cell) MTJ0 is arranged on the side of common source line SL and selection transistor (switch element) T0 is arranged on the side of bit line BL in cell unit CELL0. In cell unit CELL1, magnetoresistive element MTJ1 is arranged on the side of common source line SL and selection transistor T1 is arranged on the side of bit line bBL.

In the present, example, cell units CELL0, CELL1 may have any of the first and second patterns.

Figure 13:
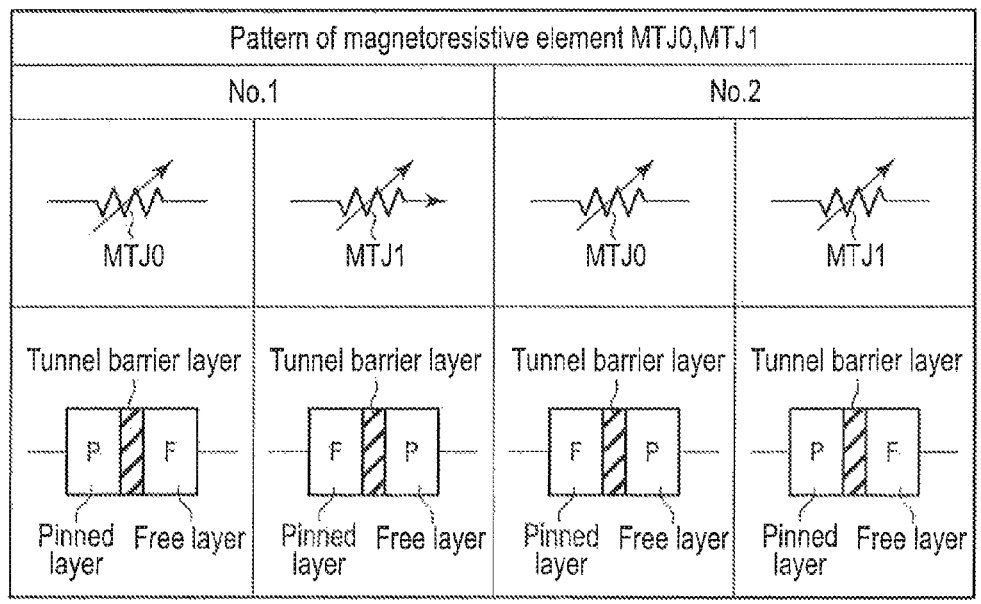
FIG. 13 is a diagram showing patterns of a magnetoresistive element.

FIG. 13 shows patterns of a magnetoresistive element.

The example relates to arrangement of a pinned layer and a free layer of magnetoresistive elements MTJ0, MTJ1 inside cell units CELL0, CELL1 in the 2-cell/1-bit structure in FIG. 12.

Each of magnetoresistive elements MTJ0, MTJ1 includes pinned layer P whose magnetisation state is invariant and free layer F whose magnetization state is variant. Pinned layer P and free layer F of magnetoresistive elements MTJ0, MTJ1 are arranged symmetrically to common source line SL.

In the first pattern (No. 1), pinned layer P of magnetoresistive element MTJ0 is arranged on the side of bit line BL in each of the first and second patterns (No. 1 and No. 2) in FIG. 12 and free layer F of magnetoresistive element MTJ0 is arranged on the side of common source line SL in each of the first and second patterns (No. 1 and No. 2) in FIG. 12.

Further, pinned layer P of magnetoresistive element MTJ1 is arranged on the side of bit line bBL in each of the first and second patterns (No. 1 and No. 2) in FIG. 12 and free layer F of magnetoresistive element MTJ1 is arranged on the side of common source line SL in each of the first, and second patterns (No. 1 and No. 2) in FIG. 12.

That is, the arrangement of pinned layer P and free layer F of magnetoresistive elements MTJ0, MTJ1 is symmetric to common source line SL.

In the second pattern (No. 2), pinned layer P of magnetoresistive element MTJ0 is arranged on the side of common source line SL in each of the first and second patterns (No. 1 and No. 2) in FIG. 12 and free layer F of magnetoresistive element MTJ0 is arranged on the side of bit line BL in each of the first and second patterns (No. 1 and No. 2) in FIG. 12.

Further, pinned layer of magnetoresistive element MTJ1 is arranged on the side of common source line SL in each of the first and second patterns (No. 1 and No. 2) in FIG. 12 and free layer F of magnetoresistive element MTJ1 is arranged on the side of bit line bBL in each of the first and second patterns (No. 1 and No. 2) in FIG. 12.

That is, the arrangement of pinned layer and free layer F of magnetoresistive elements MTJ0, MTJ1 is symmetric to common source line SL.

In the present example, magnetoresistive element MTJ may have any of the first and second patterns.

FIG. 14 shows a configuration example of a sense amplifier.

Sense amplifier S/A adopts the differential voltage sensing method that compares potentials Vread0, Vread1 of two bit lines BL, bBL. The present example also adopts the discharge type that pre-discharges bit lines BL, bBL before a sensing operation.

Sense amplifier S/A includes first inverter I1 whose input terminal is connected to bit line BL and whose output terminal is connected to bit line bBL and second inverter I2 whose input terminal is connected to bit line bBL and whose output terminal is connected to bit line BL.

Sense amplifier S/A is activated by activation signal bSE3. For example, when activation signal bSE3 is "L", sense amplifier S/A is activated.

Equalise/pre-discharge circuit EQ/PRE is connected between two bit lines BL, bBL to equalize the potential of bit lines BL, DBL with, for example, ground potential Vss and also pre-discharge bit lines BL, bBL.

In the present example, equalize/pre-discharge circuit ESQ/PRE sets bit lines BL, bBL to ground potential Vss by pre-discharging bit lines BL, bBL.

Cell units CELL0, CELL1, power transistor PSW, and column selection transistor CSW are the same as those in FIG. 10 and thus, the description thereof is omitted here.

In the present example, data in the magnetoresistive element (memory cell) is read by the accumulated charge method (voltage sensing method) using the sense amplifier in FIG. 14.

According to the voltage sensing method in the present example, bit line BL is discharged to set to a first potential (for example, ground potential Vss) before being changed to a floating state in cell unit CELL0. By setting common source line SL to a second potential (for example, power potential Vdd; higher than the first potential, the potential of bit line BL in a floating state is changed to a value in accordance with the resistance value of the magnetoresistive element in cell unit CELL0.

Similarly, in cell unit CELL1, bit line bBL is discharged to set to the first potential (for example, ground potential Vss) before being changed, to a floating state. By setting common source line SL to a second potential (for example, power potential Vdd) higher than the first potential, the potential of bit line bBL in a floating state is changed to a value in accordance with the resistance value of the magnetoresistive element in cell unit CELL1.

Then, a potential difference between potential (read potential) Vread0 of bit line BL in a floating state and potential (read, potential) Vread1 of bit line bBL in a floating state is detected by using sense amplifier S/A and also the potential difference is amplified to output read data DATA_OUT.

In contract to the first embodiment in which read potential Vread is compared with reference potential Vref, two read potentials Vread0, Vread1 based on complementary data in the second embodiment and thus, the read margin is advantageously improved.

According to the voltage sensing method, like the current sensing method, the current flowing through cell unit CELL and reference unit REF can be adjusted by adding a clamp circuit.

The timing waveform chart when read by the voltage sensing method using the sense amplifier in FIG. 14 is the same as the timing waveform chart (see FIG. 7) used in the first embodiment and thus, the description thereof is omitted here.

FIG. 15 shows a configuration example of the sense amplifier.

Sense amplifier S/A adopts the differential voltage sensing method that compares potentials Vread0, Vread1 of two bit lines BL, bBL. The present example also adopts the pre-charge type that pre-charges bit lines BL, DBL before a sensing operation.

Sense amplifier S/A includes first inverter I1 whose input terminal is connected, to bit line BL and whose output terminal is connected to bit line bBL and second inverter I2 whose input terminal is connected to bit line bBL and whose output terminal is connected to bit line BL.

Sense amplifier S/A is activated by activation signal SE3. For example, when activation signal SE3 is "H", sense amplifier S/A is activated.

Equalize/pre-charge circuit EQ/PRE is connected between two bit lines BL, bBL to equalize the potential of bit lines BL, bBL with, for example, power potential Vdd and also pre-charge bit lines BL, bBL.

In the present example, equalize/pre-charge circuit EQ/PRE sets bit lines BL, bBL to power potential Vdd by pre-charging bit lines BL, bBL.

Cell units CELL0, CELL1, power transistor PSW, and column selection transistor CSW are the same as those in FIG. 10 and thus, the description thereof is omitted here.

In the present example, data in the magnetoresistive element (memory cell) is read by the accumulated charge method (voltage sensing method) using the sense amplifier in FIG. 15.

According to the voltage sensing method in the present example, bit line BL is pre-charged to set to the first potential (for example, power potential Vdd) before being changed to a floating state on the side of cell unit CELL. By setting common source line SL to a second potential (for example, ground potential Vss) lower than the first potential, the potential of bit line BL in a floating state is changed to a value in accordance with the resistance value of the magnetoresistive element in cell unit CELL0.

Similarly, in cell unit. CELL1, bit line bBL is pre-charged to set to the first potential (for example, power potential Vdd) before being changed to a floating state. By setting common source line SL to the second potential (for example, ground potential Vss) lower than the first potential, the potential of bit line bBL in a floating state is changed to a value in accordance with the resistance value of the magnetoresistive element in cell unit CELL1.

Then, a potential difference between potential (read potential) Vread0 of bit line BL in a floating state and potential (read potential) Vread1 of bit line bBL in a floating state is detected by using sense amplifier S/A and also the potential difference is amplified to output read data DATA_OUT.

In contract to the first embodiment in which read potential Vread is compared, with reference potential Vref, two read potentials Vread0, Vread1 based on complementary data in the second embodiment and thus, the read margin is advantageously improved.

According to the voltage sensing method, like the current sensing method, the current flowing through cell unit CELL and reference unit REF can be adjusted by adding a clamp circuit.

The timing waveform chart when read by the voltage sensing method using the sense amplifier in FIG. 15 is the same as the timing waveform chart (see FIG. 9) used in the first embodiment and thus, the description thereof is omitted here.

FIG. 16 shows a potential difference and current value by the voltage sensing method.

The potential difference is a potential difference between two bit lines BL, bBL during reading. The current value is a current value flowing through cell units CELL0, CELL1 during reading.

That is, one (smaller side of the current, value) of two waveforms of the current value is a current value flowing through the cell unit having a magnetoresistive element in a high-resistance state ("1" state) of cell units CELL0, CELL1 and the other (larger side of the current value) of two waveforms of the current value is a current value flowing through the cell unit having a magnetoresistive element in a low-resistance state ("0" state) of cell units CELL0, CELL1.

According to the voltage sensing method, effects of not only improving the margin and speed during reading, but also being able to realize lower power consumption when compared with the current sensing method are achieved.

When the potential of bit lines BL, bBL in a floating state is charged, the voltage applied to the magnetoresistive element in cell units CELL0, CELL1 decreases with an increasing potential of bit lines BL, bBL and so the value of current flowing therethrough also decreases.

The decrease in current value occurs markedly in cell units having a magnetoresistive element in a low-resistance state ("0" state). Thus, as shown in FIG. 16, the potential difference between two bit lines BL, bBL decreases with the passage of time after peaking at some point. This has an effect on lower power consumption during reading.

This also means that, however, a read error occurs if the timing to activate the sense amplifier is not adjusted at the same time to a period in which the potential difference between two bit lines BL, bBL is sufficiently large.

Therefore, according to the voltage sensing method in the present embodiment, it is necessary to adjust the timing when word line WL is set to "H" and the timing when activation signal SE3 to "H" to an optimum period. Further, a method by which bit lines SL, bBL and sense amplifier S/A are electrically separated when a fixed period passes after word line WL being set to "H" may be adopted.

According to the method of electrically separating bit lines BL, bBL and sense amplifier S/A, two input, potentials (potential difference) input into sense amplifier S/A are determined at the time of separation of both and thus, for example, there is no need of control such as adjusting the timing of activating sense amplifier S/A.

According to the voltage sensing method in the present embodiment, period t1 before the potential difference of two bit lines BL, bBL becomes necessary value x1 is about, for example, 0.6 nsec. The current value is the largest (for example, about 10 μA) immediately after word line WL being set to "H" and then gradually decreases.

The maximum value of the current value is sufficiently smaller than the write, current value.

Figure 17:
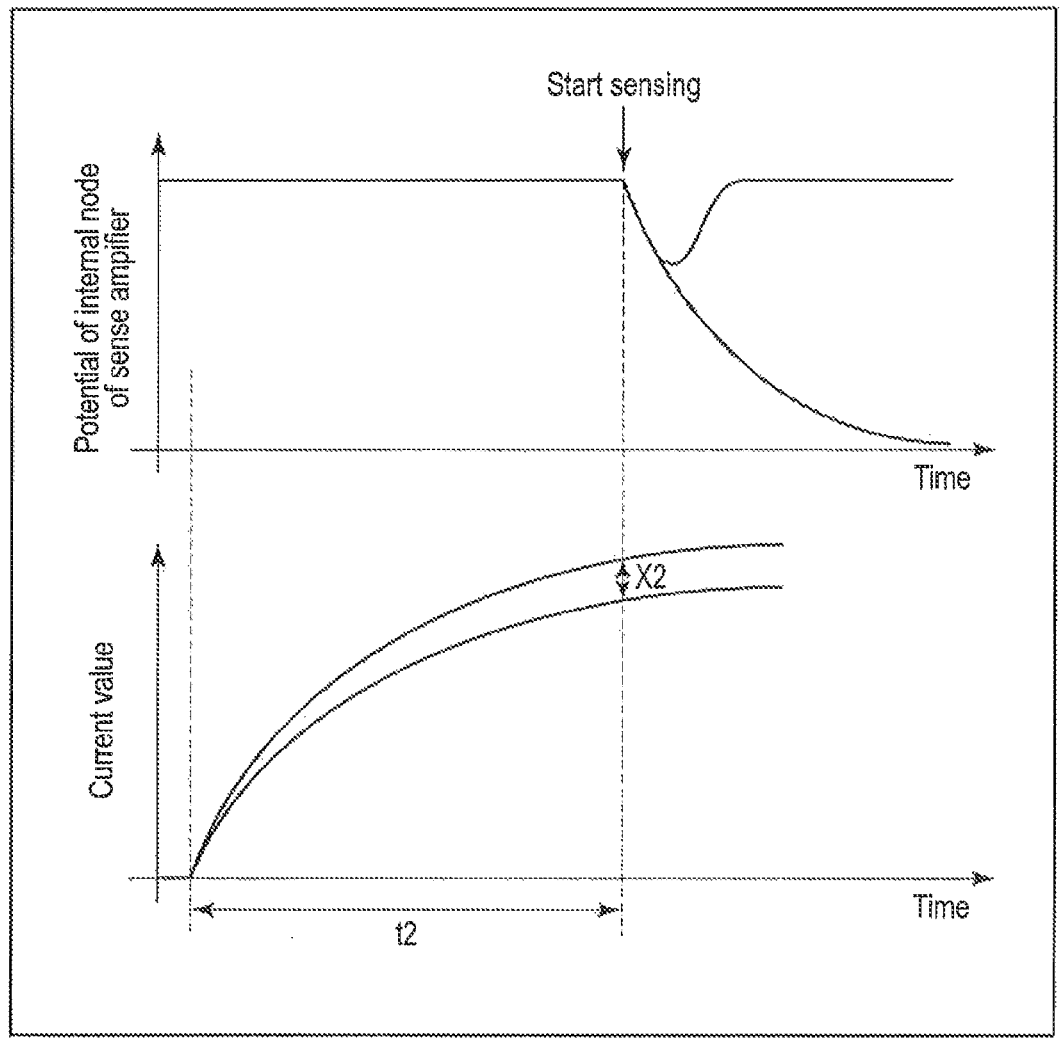
FIG. 17 is a diagram showing the potential difference and current value by the voltage sensing method.

In the current sensing method, by contrast, as shown in, for example, FIG. 17, period t2 before activation of sense/amplifier S/A after word line WL being set to "H" is after the current value sufficiently stabilizes and an occurrence of sufficient potential difference x2 and period t2 is about, for example, 6 nsec, which is about 10 times that, according to the voltage sensing method in the present embodiment.

In the current sensing method, the current value always maintains a high value (for example, 10 μA or so) after word line WL being set to "H".

Figure 18:
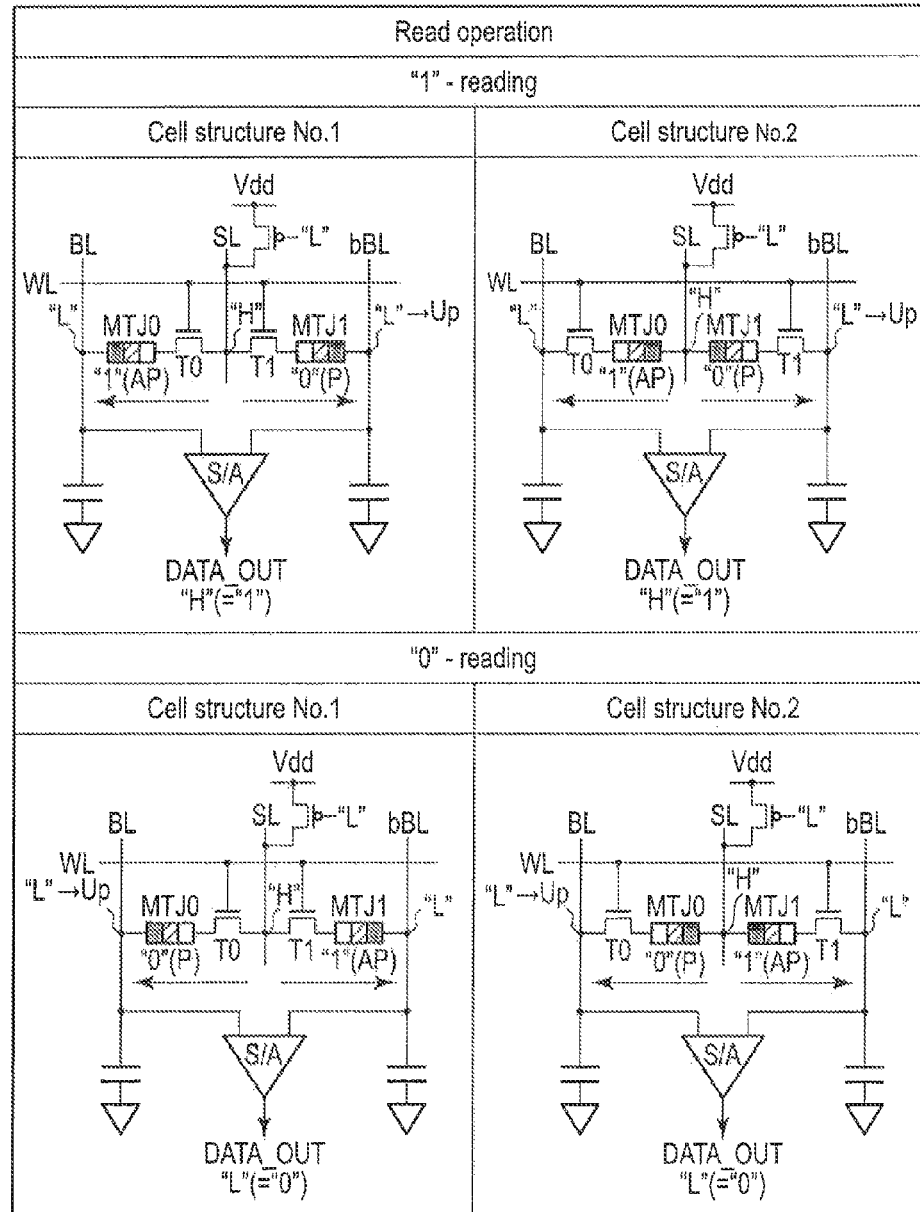
FIG. 18 is a diagram showing a read operation.

FIG. 18 shows a read operation.

If, for example, magnetoresistive element MTJ0 is anti-parallel (AP), which is a high-resistance state ("1" state), and magnetoresistive element MTJ1 is parallel (P), which is a low-resistance state ("0" state), sense amplifier S/A outputs "H" (="1") ("1" reading) as read data DATA_OUT.

Also if, for example, magnetoresistive element MTJ0 is parallel (P), which is a low-resistance state ("0" state), and magnetoresistive element MTJ1 is anti-parallel (AP), which is a high-resistance state ("1" state), sense amplifier S/A outputs "L" (="0") ("0" reading) as read data DATA_OUT.

Figure 19:
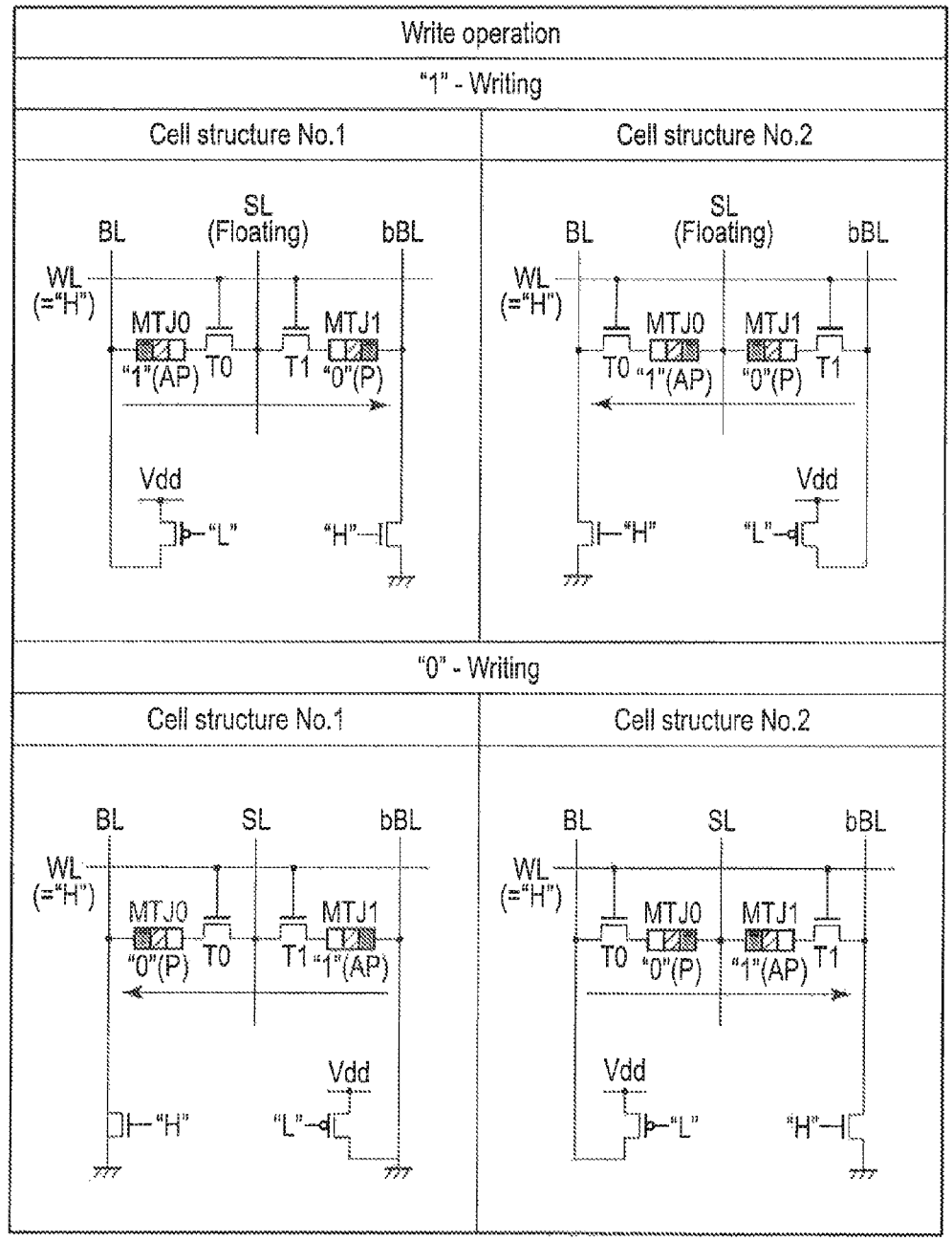
FIG. 19 is a diagram showing a write operation.

FIG. 19 shows a write operation.

In the second embodiment, as described above, magnetoresistive elements in two cell units CELL0, CELL1 are arranged symmetrically to common source line SL so that two cell units CELL0, CELL1 can be written to simultaneously.

When, for example, a write current is passed from the side of bit line BL toward the side of bit line bBL, magnetoresistive element MTJ0 can be set to anti-parallel (AP), which is a high-resistance state ("1" state), and magnetoresistive element MTJ1 can be set to parallel (P), which is a low-resistance state ("0" state), simultaneously ("1" writing).

Also when, for example, a write current is passed from the side of bit line bBL toward the side of bit line BL, magnetoresistive element MTJ0 can be set to parallel (P), which is a low-resistance state ("0" state), and magnetoresistive element MTJ1 can be set to anti-parallel (AP), which is a high-resistance state ("1" state), simultaneously ("0" writing).

According to the second embodiment, as described above, when compared with the first embodiment using the reference current, data can be read still faster with stability by storing complementary data using two cell units.

Third Embodiment

The present embodiment also relates to a magnetic random access memory in a 2-cell/1 bit structure.

The present embodiment is different from the second embodiment, in a path through which a write current, flows through two cell units CELL0, CELL1 during writing.

FIG. 20 shows a memory cell array, write circuit, and read circuit.

Also in the present embodiment, 1-bit data is stored by using two cell units CELL0, CELL1. Complementary data is stored in two cell units CELL0, CELL1.

The configuration of cell units CELL0, CELL1 in memory cell array 10 and column selection transistor CSW is the same as in the second embodiment and thus, the description thereof is omitted here.

Write circuit 13a includes write drivers/sinkers DS1, DS2. Write driver/sinker DS1 is connected to one end of bit line BL and write driver/sinker DS2 is connected to one end of common source line SL.

Further, write drivers/sinkers DS1, DS2 include, for example, two P channels FET and two N channels FET connected in series between power terminal Vdd and ground terminal Vss.

Further, switch element (FET) Sw to short-circuit bit line BL and bit line bBL during writing is connected to therebetween. Switch element Sw plays the role of short-circuiting two bit lines BL, bBL to connect both bit lines to driver/sinker DS1 when control signal φw becomes "H" during writing.

When, for example, write enable signal WE is "H" and inversion signal bWE thereof is "L", drivers/sinkers DS1, DS2 are activated.

Therefore, when write data DATA_IN is "1", a write current flows in a direction from driver/sinker DS2 (common source line SL side) toward driver/sinker DS1 (bit line BL side) in cell unit CELL0 and a write current flows in a direction from driver/sinker DS2 (common source line SL side) toward driver/sinker DS1 (bit line bBL side) in cell unit CELL1 after two bit lines BL, bBL being short-circuited by setting control signal φw to "H".

When write data DATA_IN is "0", a write current flows in a direction from, driver/sinker DS1 (bit line BL side) toward driver/sinker DS2 (common source line SL side) in cell unit CELL0 and a write current flows in a direction from driver/sinker DS1 (bit line bBL side) toward driver/sinker DS2 (common source line SL side) in cell unit CELL1 after two bit lines BL, bBL being short-circuited by setting control signal φw to "H".

Also when, for example, write enable signal WE is "L" and inversion signal bWE thereof is "H", drivers/sinkers DS1, DS2 are inactivated.

Read circuit 13b includes, for example, power transistor (FET) PSW connected to common source line SL and sense amplifier S/A connected to bit lines BL, bBL.

For example, power transistor PSW is turned on when activation signal bSE2 is "L" and sense amplifier S/A is activated when activation signal SE3 is "H".

Therefore, read data DATA_OUT can be read from the magnetoresistive element in cell units CELL0, CELL1 by, for example, detecting a potential difference of bit lines BL, bBL in a floating state by using sense/amplifier S/A.

Also in the present embodiment, like in the first embodiment, write circuit 13a can be modified. That is, when the voltage drop of the write drivers/sinkers in write circuit 13a should be made smaller, it is desirable to adopt the example shown in FIG. 21.

FIG. 21 shows the memory cell array, write circuit, and read circuit.

The present example is different from the example shown in FIG. 20 in the configuration of write circuit 13a. The configuration of write circuit 13a is the same as in FIG. 3 except the following points.

That is, write driver/sinker DS1 is connected to bit line BL and also to bit line bBL via switch element. Sw. Driver/sinker DS2 is connected to common source line SL.

Two bit lines BL, bBL are short-circuited by setting control signal φw to "H".

When write enable signal WE is "H" and inversion signal bWE thereof is "L", NAND gate circuits ND1-2, ND1-3 and NOR gate circuits NR1-l, NR1-2 output output signals in accordance with the value of write data DATA_IN.

When, for example, write data DATA_IN is "1", the output signal of NAND gate circuit ND1-2 and that of NOR gate circuit NR1-1 are both "1". Thus, write driver/sinker DS1 connects bit lines BL, bBL to ground terminal Vss. Further, the output signal of NAND gate circuit ND1-3 and that of NOR gate circuit NR1-2 are both "0". Thus, write driver/sinker DS2 connects common source line SL to power terminal Vdd.

Therefore, a write current in a direction from driver/sinker DS2 (common source line SL) toward driver/sinker DS1 (bit lines BL, bBL) flows to cell units CELL0, CELL1.

When, for example, write data DATA_IN is "0", the output signal of NAND gate circuit ND1-2 and that of NOR gate circuit NR1-1 are both "0". Thus, write driver/sinker DS1 connects bit lines BL, bBL to power terminal Vdd. Further, the output signal of NAND gate circuit ND1-3 and that of NOR gate circuit NR1-2 are both "1". Thus, write driver/sinker DS2 connects common source line SL to ground terminal Vss.

Therefore, a write current in a direction from driver/sinker DS1 (bit lines BL, bBL) toward driver/sinker DS2 (common source line SL) flows to cell unit CELL.

In examples in FIGS. 20 and 21, driver/sinker DS1 is commonly connected to two bit lines BL, bBL, but a driver/sinker may independently be connected to each of bit line BL and bit line bBL. In this case, switch element Sw shown in FIGS. 20 and 21 may be omitted.

For example, if write circuit 13a in FIG. 20 is taken as an example, as shown in FIG. 22, driver/sinker DS1-1 is connected to bit line BL and driver/sinker DS1-2 is connected to bit line bBL.

Figure 23:
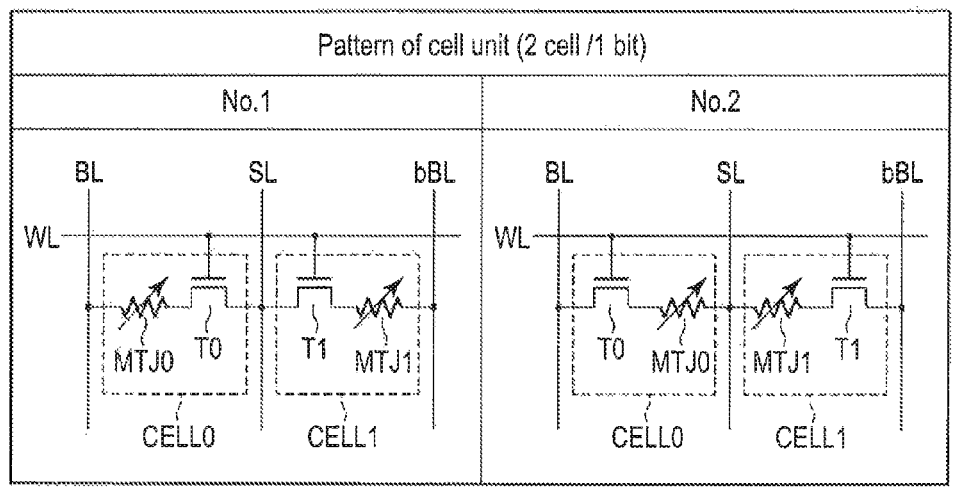
FIG. 23 is a diagram showing patterns of a cell unit.

FIG. 23 shows patterns of a cell unit in a 2-cell/1-bit structure.

Cell unit CELL0 includes magnetoresistive element MTJ0 and selection transistor (FET) T0 connected in series. Further, cell unit CELL1 includes magnetoresistive element MTJ1 and selection transistor (FET) T1 connected in series.

In a first pattern (No. 1), magnetoresistive element, (memory cell) MTJ0 is arranged on the side of bit line BL and selection transistor (switch element) T0 is arranged on the side of common source line SL in cell unit CELL0. In cell unit CELL1, magnetoresistive element MTJ1 is arranged on the side of bit line bBL and selection transistor T1 is arranged on the side of common source line SL.

In a second pattern (No. 2), magnetoresistive element (memory cell) MTJ0 is arranged on the side of common source line SL and selection transistor (switch element) T0 is arranged on the side of bit line BL in cell unit CELL0. In cell unit. CELL1, magnetoresistive element MTJ1 is arranged on the side of common source line SL and selection transistor T1 is arranged on the side of bit line bBL.

In the present example, cell units CELL0, CELL1 may have any of the first and second patterns.

Figure 24:
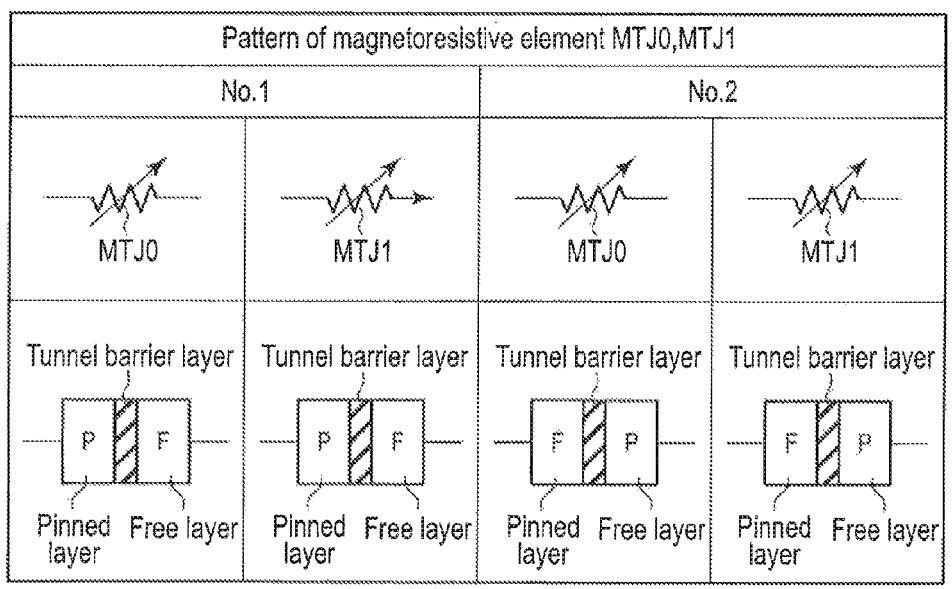
FIG. 24 is a diagram showing patterns of a magnetoresistive element.

FIG. 24 shows patterns of a magnetoresistive element.

The example relates to arrangement of a pinned layer and a free layer of magnetoresistive elements MTJ0, MTJ1 inside cell units CELL0, CELL1 in the 2-cell/1-bit structure in FIG. 23.

Each of magnetoresistive elements MTJ0, MTJ1 includes pinned layer F whose magnetization state is invariant and free layer F whose magnetization state is variant. Pinned layer P and free layer F of magnetoresistive elements MTJ0, MTJ1 are arranged asymmetrically to common source line SL.

In the first pattern (No. 1), pinned layer P of magnetoresistive element MTJ0 is arranged on the side of bit line BL in each of the first and second patterns (No. 1 and No. 2) in FIG. 23 and free layer F of magnetoresistive element MTJ0 is arranged on the side of common source line BL in each of the first and second patterns (No. 1 and No. 2) in FIG. 23.

Further, pinned layer P of magnetoresistive element MTJ1 is arranged on the side of common source line SL in each of the first and second patterns (No. 1 and No. 2) in FIG. 23 and free layer F of magnetoresistive element MTJ1 is arranged on the side of bit line bBL in each of the first and second, patterns (No. 1 and No. 2) in FIG. 23.

That is, the arrangement of pinned layer P and free layer F of magnetoresistive elements MTJ0, MTJ1 is asymmetric to common source line SL.

In the second pattern (No. 2), pinned layer P of magnetoresistive element MTJ0 is arranged on the side of common source line SL in each of the first and second patterns (No. 1 and No. 2) in FIG. 23 and free layer F of magnetoresistive element MTJ0 is arranged on the side of bit line BL in each of the first and second patterns (No. 1 and No. 2) in FIG. 23.

Further, pinned layer P of magnetoresistive element MTJ1 is arranged on the side of bit line bBL in each of the first and second patterns (No. 1 and No. 2) in FIG. 23 and free layer F of magnetoresistive element MTJ1 is arranged on the side of common source line SL in each of the first and second patterns (No. 1 and No. 2) in FIG. 23.

That is, the arrangement of pinned layer and free layer F of magnetoresistive elements MTJ0, MTJ1 is asymmetric to common source line SL.

In the present example, magnetoresistive element MTJ may have any of the first and second patterns.

The configuration of the sense amplifier and the reading method in the present embodiment are the same as those in the second embodiment (see FIG. 14) and thus, the description thereof is omitted.

Figure 25:
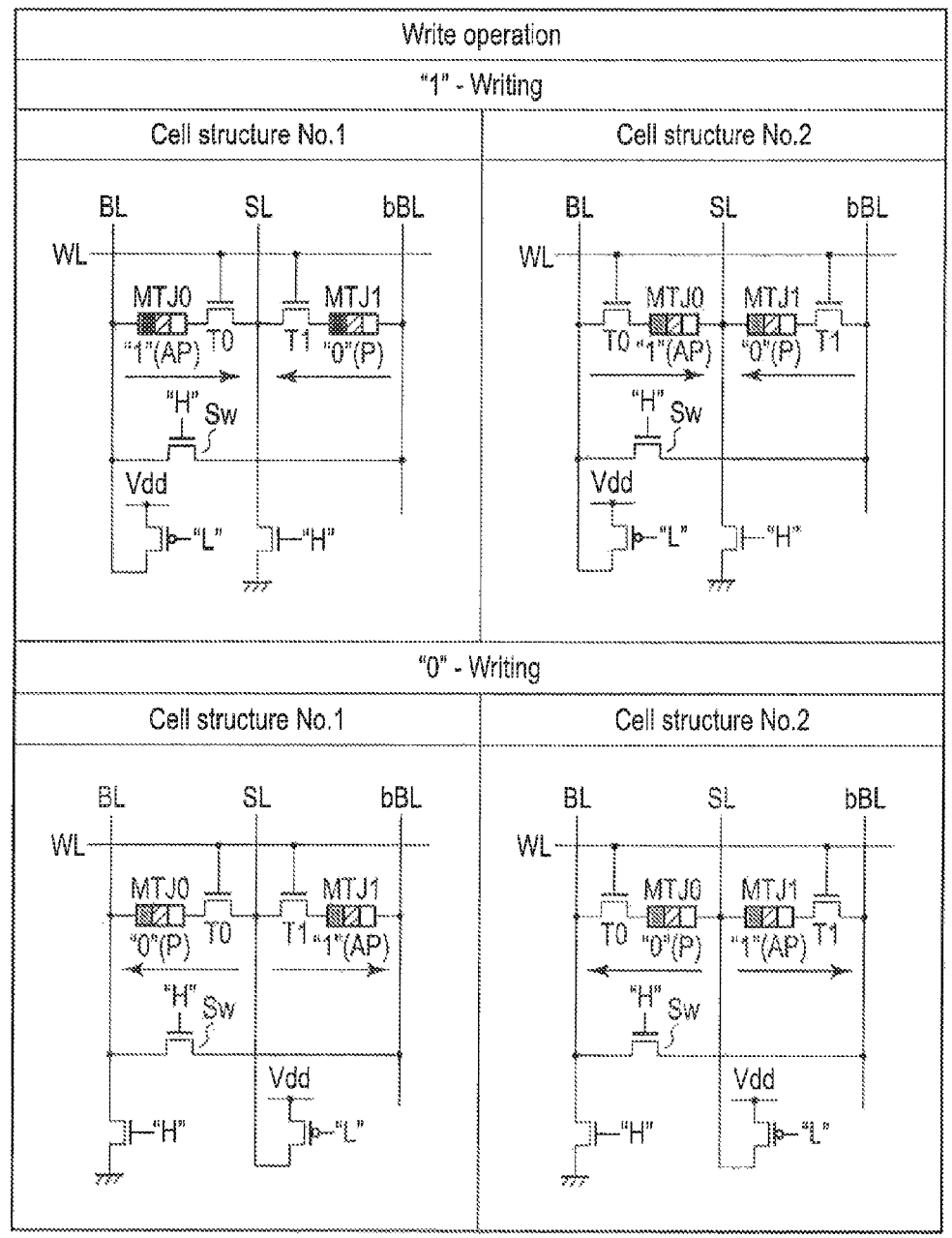
FIG. 25 is a diagram showing the write operation.

FIG. 25 shows the write operation.

In the third embodiment, as described above, magnetoresistive elements in two cell units CELL0, CELL1 are arranged asymmetrically to common source line SL so that two cell units CELL0, CELL1 can be written to simultaneously.

When, for example, a write current is passed from the side of bit lines BL, bBL toward the side of common source line SL, magnetoresistive element MTJ0 can be set to anti-parallel (AP), which is a high-resistance state ("1" state), and magnetoresistive element MTJ1 can be set to parallel (P), which is a low-resistance state ("0" state), simultaneously ("1" writing).

Also when, for example, a write current is passed from the side of common source line SL toward the side of bit lines BL, bBL, magnetoresistive element MTJ0 can be set to parallel (P), which is a low-resistance state ("0" state), and magnetoresistive element MTJ1 can be set to anti-parallel (AP), which is a high-resistance state ("1" state), simultaneously ("0" writing).

[Others]

In the above first to third embodiments, it is assumed that each switch (the selection transistor, column selection switch and the like, in a cell unit) is an n-channel FET, but the embodiments are not limited to such an example and a p-channel FET may also be adopted.

It is also assumed that a bit line is discharged to set to ground potential Vss in the voltage sensing method, but for example, the bit line may be pre-charged to power potential Vdd before being changed to a floating state.

Further, regarding FIGS. 2, 3, 10, 11, and 20 to 22, the control method of a write current depends on the configuration of a cell unit and thus, the control signal that controls the direction of a write current in a write circuit, can be changed from write data DATA_IN to inversion signal bDATA_IN thereof appropriately in accordance with the configuration of the cell unit.

[Layout]

An example of the layout of a 2-transistor/1-bit structure will be described below.

In FIGS. 26 to 29, each symbol corresponds to the symbol used in the above first to third embodiments.

Active area AA corresponds to a thinly filled region in FIGS. 26 to 29. That is, in the example in FIG. 26, one memory cell (cell units CELL0, CELL1) is arranged in one active area AA. In the examples in FIGS. 27 to 29, by contrast, cell unit CELL0 and cell unit CELL1 in one memory cell are arranged in mutually different active areas AA.

Among layouts in FIGS. 26 to 29, the layout in FIG. 27 is characterized in that the space between magnetoresistive elements MTJ is the widest. Layouts in FIGS. 28 and 29 have a selection transistor in cell units CELL0, CELL1 having a size (channel width) twice the size in layouts in FIGS. 26 and 27.

Figure 28:
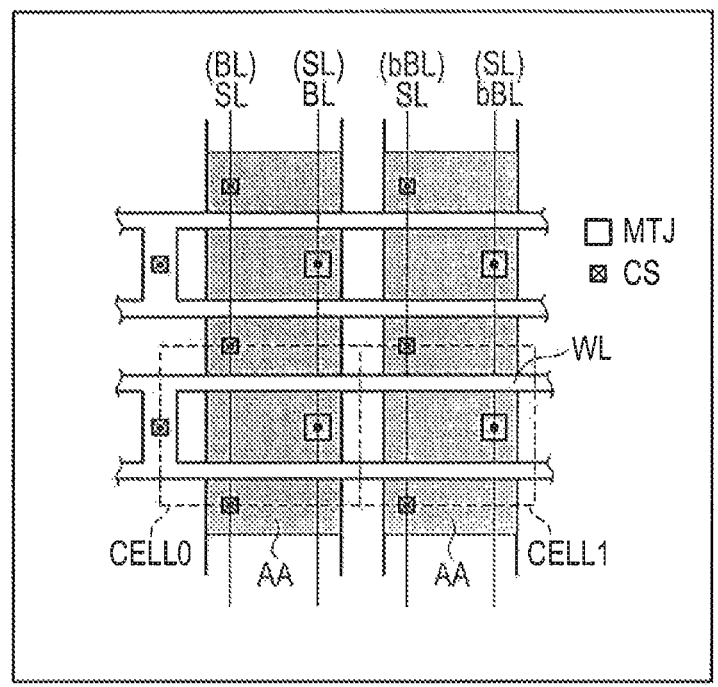
Figure 29:
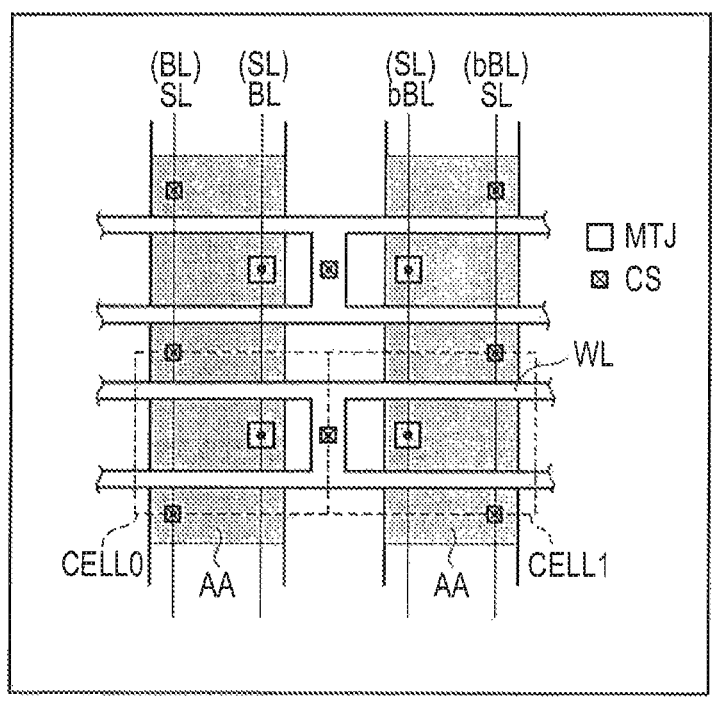

Thus, the value of write current during writing can be increased in layouts in FIGS. 28 and 29. Also in layouts in FIGS. 28 and 29, the layout of word line WL, bit lines BL, bBL, and common source line SL is made easier and also an increase in size of cell units CELL0, CELL1 is inhibited by devising the arrangement of active area AA.

In consideration of the above, the most desirable layout is the layout in FIG. 28 or FIG. 29.

In the layout in FIG. 28, a first switch element in cell unit CELL0 includes first, second, and third impurity regions formed in first active area AA and a common gate electrode (word line WL) arranged on each of a channel between the first and second impurity regions and a channel between the first and third impurity regions.

Further, a second switch element in cell unit CELL1 includes fourth, fifth, and sixth impurity regions formed in second active area AA and a common gate electrode (word line WL) arranged on each of a channel between the fourth and fifth impurity regions and a channel between the fourth and sixth impurity regions.

The first and second switch elements in two cell units CELL0, CELL1 are arranged side by side in a direction in which the common gate electrode (word line WL) extends and laid out in the same direction.

In the layout in FIG. 29, a first switch element in cell unit CELL0 includes first, second, and third impurity regions formed in first active area AA and a common gate electrode (word line WL) arranged on each of a channel between the first and second impurity regions and a channel between the first and third impurity regions.

Further, a second switch element in cell unit CELL1 includes fourth, fifth, and sixth impurity regions formed in second active area AA and a common, gate electrode (word line WL) arranged on each of a channel between the fourth and fifth impurity regions and a channel between the fourth and sixth impurity regions.

The first and second switch elements in two cell units CELL0, CELL1 are arranged side by side in a direction in which the common gate electrode (word line WL) extends and laid out in the opposite direction.

In FIGS. 26 to 29, MTJ represents a magnetoresistive element and CS represents, for example, a contact with a silicon channel (active area) or word line WL.

A pitch with which a contact with word line WL is provided can arbitrarily be determined. That is, contacts with word line WL are shown in the present example and may not be shown if the pitch with which contacts with the word line are provided is wide.

Application Example

A magnetic random access memory according to any of the above embodiments can be applied to, for example, a cache memory of a low-power consuming processor.

If, for example, a conventional magnetic random access memory is used simply as a cache memory, a problem, of increased power consumption particularly during reading is posed when compared with a cache memory of SRAM (SPAM cache).

In contrast, a cache memory (MRAM cache) of a magnetic random access memory according to the present embodiment adopts, for example, reading technology by the voltage sensing method by which a discharged bit line is changed to a floating state and then the potential of the bit line is changed in accordance with the resistance value of a magnetoresistive element.

Therefore, power consumption during reading and latency (delay time) can be improved and, as a result, lower power consumption during reading equivalent to that of an SRAM cache or more and faster speed can be achieved.

CONCLUSION

According to an embodiment, power consumption during reading and latency of a magnetic random access memory can be improved.

While certain embodiments have been described, these embodiments have been presented by way of example only, and are not intended to limit the scope of the inventions. Indeed, the novel embodiments described, herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic random access memory comprising:
   first and second bit lines;
   a common source line;
   a first cell unit including a first magnetoresistive element connected between the first bit line and the common source line;
   a second cell unit including a second magnetoresistive element connected between the second bit line and the common source line;
   a write circuit to write complementary data to the first and second magnetoresistive elements in the first and second cell units;
   a read circuit to read the complementary data from the first and second magnetoresistive elements in the first and second cell units; and
   a control circuit that is configured to:
   change the first and second bit lines to a floating state after setting the first and second bit lines to a first potential;
   change a potential of the first bit line in the floating state to a first value in accordance with a resistance value of the first magnetoresistive element and a potential of the second bit line in the floating state to a second value in accordance with a resistance value of the second magnetoresistive element by setting the common source line to a second potential different from the first potential; and
   control the read circuit so that the read circuit detects a difference between the first value of the potential of the first bit line in the floating state and the second value of the potential of the second bit line in the floating state.

2. The memory of claim 1, wherein each of the first and second magnetoresistive elements includes
   a reference layer with an invariable magnetization and a free layer with a variable magnetization, and
   arrangement of the reference layer and the free layer of the first magnetoresistive element and the arrangement of the reference layer and the free layer of the second magnetoresistive element are symmetric to the common source line.

3. The memory of claim 2, wherein the control circuit is configured to control the write circuit so that the write circuit writes complementary data to the first and second magnetoresistive elements to pass a first write current from the first bit line toward the second bit line via the first and second magnetoresistive elements or a second write current from the second bit line toward the first bit line via the first and second magnetoresistive elements.

4. The memory of claim 1, wherein each of the first and second magnetoresistive elements includes
   a reference layer with an invariable magnetization and a free layer with a variable magnetization, and
   arrangement of the reference layer and the free layer of the first magnetoresistive element and the arrangement of the reference layer and the free layer of the second magnetoresistive element are asymmetric to the common source line.

5. The memory of claim 4, wherein the control circuit is configured to control the write circuit so that the write circuit writes complementary data to the first and second magnetoresistive elements to pass a first write current from the first and second bit lines toward the common source line via the first and second magnetoresistive elements or a second write current from the common source line toward the first and second bit lines via the first and second magnetoresistive elements.

6. The memory of claim 1, wherein the first cell unit includes
a first switch element serially connected to the first magnetoresistive element,
the first magnetoresistive element is arranged on the side of the first bit line,
the first switch element is arranged on the side of the common source line,
the second cell unit includes a second switch element serially connected to the second magnetoresistive element,
the second magnetoresistive element is arranged on the side of the second bit line, and
the second switch element is arranged on the side of the common source line.

7. The memory of claim 1, wherein the first cell unit includes a first switch element serially connected to the first magnetoresistive element,
the first magnetoresistive element is arranged on the side of the common source line,
the first switch element is arranged on the side of the first bit line,
the second cell unit includes a second switch element serially connected to the second magnetoresistive element,
the second magnetoresistive element is arranged on the side of the common source line, and
the second switch element is arranged on the side of the second bit line.

8. The memory of claim 1, wherein the read circuit includes a first inverter and a second inverter,
the first inverter has an input terminal connected to the first bit line and an output terminal connected to the second bit line, and
the second inverter has an input terminal connected to second bit line and an output terminal connected to the first bit line.

9. The memory of claim 6, wherein the first switch element includes:
first, second, and third impurity regions provided in a first active area; and
a common gate electrode arranged on each of a channel between the first and second impurity regions and a channel between the first and third impurity regions,
the second switch element includes:
fourth, fifth, and sixth impurity regions provided in a second active area; and
the common gate electrode arranged on each of a channel between the fourth and fifth impurity regions and a channel between the fourth and sixth impurity regions, and
the first and second switch elements are arranged in a direction in which the common gate electrode extends and laid out in the same direction.

10. The memory of claim 7, wherein the first switch element includes:
first, second, and third impurity regions formed in a first active area; and
a common gate electrode arranged on each of a channel between the first and second impurity regions and a channel between the first and third impurity regions,
the second switch element includes:
fourth, fifth, and sixth impurity regions formed in a second active area; and
the common gate electrode arranged on each of a channel between the fourth and fifth impurity regions and a channel between the fourth and sixth impurity regions, and
the first and second switch elements are arranged in a direction in which the common gate electrode extends and laid out in the same direction.

11. The memory of claim 6, wherein the first switch element includes:
first, second, and third impurity regions formed in a first active area; and
a common gate electrode arranged on each of a channel between the first and second impurity regions and a channel between the first and third impurity regions,
the second switch element includes:
fourth, fifth, and sixth impurity regions formed in a second active area; and
the common gate electrode arranged on each of a channel between the fourth and fifth impurity regions and a channel between the fourth and sixth impurity regions, and
the first and second switch elements are arranged in a direction in which the common gate electrode extends and laid out in the opposite direction.

12. The memory of claim 7, wherein the first switch element includes:
first, second, and third impurity regions formed in a first active area; and
a common gate electrode arranged on each of a channel between the first and second impurity regions and a channel between the first and third impurity regions,
the second switch element includes:
fourth, fifth, and sixth impurity regions formed in a second active area; and
the common gate electrode arranged on each of a channel between the fourth and fifth impurity regions and a channel between the fourth and sixth impurity regions, and
the first and second switch elements are arranged in a direction in which the common gate electrode extends and laid out in the opposite direction.

13. A memory system including the memory of claim 1 as a cache memory.

14. The memory of claim 1, wherein the first potential is a ground potential and the second potential is a power source potential.

15. The memory of claim 1, wherein the second potential is higher than the first potential.

16. The memory of claim 1, wherein the second potential is lower than the first potential.

* * * * *